(12) United States Patent
Yokozeki et al.

(10) Patent No.: US 9,436,053 B2
(45) Date of Patent: Sep. 6, 2016

(54) DISPLAY UNIT AND ELECTRONIC APPARATUS

(71) Applicant: Sony Corporation, Tokyo (JP)

(72) Inventors: Mikihiro Yokozeki, Kanagawa (JP); Manabu Kodate, Kanagawa (JP); Shuichi Shima, Kanagawa (JP); Tsuyoshi Ito, Gifu (JP); Hitoshi Kubota, Nagano (JP); Etsuko Nakamura, Gifu (JP)

(73) Assignee: Joled Inc., Tokyo (JP)

( * ) Notice: Subject to any disclaimer, the term of this patent is extended or adjusted under 35 U.S.C. 154(b) by 53 days.

(21) Appl. No.: 14/290,203

(22) Filed: May 29, 2014

(65) Prior Publication Data

US 2014/0362429 A1    Dec. 11, 2014

(30) Foreign Application Priority Data

Jun. 5, 2013   (JP) ................. 2013-119220

(51) Int. Cl.
*G02F 1/153*   (2006.01)
*G02F 1/15*    (2006.01)
*G02F 1/19*    (2006.01)
*H01L 27/32*   (2006.01)

(52) U.S. Cl.
CPC .............. *G02F 1/1506* (2013.01); *G02F 1/19* (2013.01); *H01L 27/3232* (2013.01); *G02F 2201/44* (2013.01)

(58) Field of Classification Search
CPC ................. G02F 1/1506; G02F 1/19

USPC ......... 359/265–275, 245, 290, 263; 345/105, 345/107; 349/1, 19

See application file for complete search history.

(56) References Cited

U.S. PATENT DOCUMENTS

| 6,127,998 A * | 10/2000 | Ichikawa | G09G 3/3648 345/100 |
| 7,609,339 B2 * | 10/2009 | Choi | G02F 1/133514 349/104 |
| 7,852,448 B2 * | 12/2010 | Shirasaka | G02F 1/13394 349/155 |
| 2008/0002110 A1 | 1/2008 | Choi | |

FOREIGN PATENT DOCUMENTS

| JP | 10-138832 | 5/1998 |
| JP | 2005-260545 | 9/2005 |
| JP | 2005-332616 | 12/2005 |
| JP | 2009053391 | 3/2009 |
| JP | 2010-070889 | 4/2010 |

OTHER PUBLICATIONS

Office Action issued on May 24, 2016 for JP2013-119220, 6 pages.

* cited by examiner

*Primary Examiner* — Tuyen Tra
(74) *Attorney, Agent, or Firm* — K&L Gates LLP

(57) ABSTRACT

Provided is a display unit that includes: a pair of a first substrate and a second substrate that are arranged in opposition to each other; a display layer provided between the first substrate and the second substrate; and a display mode switching layer having an aperture for each pixel, and provided between the display layer and the second substrate.

23 Claims, 30 Drawing Sheets

DISPLAY UNIT AND ELECTRONIC APPARATUS

CROSS REFERENCES TO RELATED APPLICATIONS

The present application claims priority to Japanese Priority Patent Application JP 2013-119220 filed in the Japan Patent Office on Jun. 5, 2013, the entire content of which is hereby incorporated by reference.

BACKGROUND

The present disclosure relates to a display unit capable of switching display modes, and an electronic apparatus that includes such a display unit.

In recent years, a display unit combining a mirror and a display device (so-called mirror display) has been utilized in a variety of fields, and has been used as, for example, a rearview mirror or an interior display of an automobile. For example, such a mirror display is capable of displaying images with textual information and the like overlaid thereon when a person comes close (for example, see Japanese Unexamined Patent Application Publication No. H10-138832 and No. 2005-260545).

Such a mirror display may be configured, for example, in a manner to bond a half-mirror sheet and the like that function as a mirror in the front side of a display device such as liquid crystal (for example, see Japanese Unexamined Patent Application Publication No. 2010-70889).

SUMMARY

However, a mirror display in which a half-mirror sheet is arranged in the front side of a display device has been disadvantageous in that the luminance is deteriorated due to the low transmittance of the half-mirror sheet. Meanwhile, a display unit has been disclosed that uses an organic EL (Electroluminescence) device as a display device, wherein a reflective film is provided between this organic EL device and a transparent substrate (for example, see Japanese Unexamined Patent Application Publication No. 2005-332616). In this display unit, although deterioration in the luminance is improved, a reflected glare is cast on a mirror surface that is formed by the reflective film, which makes images less visible. Thus, an existing mirror display has been disadvantageous in that it is difficult to achieve the sufficient visibility.

It is desirable to provide a display unit and an electronic apparatus that have the high visibility.

According to an embodiment of the present application, there is provided a display unit including: a pair of a first substrate and a second substrate that are arranged in opposition to each other; a display layer provided between the first substrate and the second substrate; and a display mode switching layer having an aperture for each pixel, and provided between the display layer and the second substrate.

According to an embodiment of the present application, there is provided an electronic apparatus provided with a display unit. The display unit includes: a pair of a first substrate and a second substrate that are arranged in opposition to each other; a display layer provided between the first substrate and the second substrate; and a display mode switching layer having an aperture for each pixel, and provided between the display layer and the second substrate.

In the display unit and the electronic apparatus according to the respective embodiments of the present application, by providing the display mode switching layer having the apertures between the display layer and the second substrate, it is possible to switch display modes as necessary, as well as to extract light that is emitted out of the display layer at the time of displaying images from the apertures.

According to the display unit and the electronic apparatus in the respective embodiments of the present application, the display mode switching layer is provided between the display layer and the second substrate, and thus it is possible to switch display modes. For example, a switchover may be made between a mirror display and a black display (image display) as necessary. Further, the apertures are provided at positions corresponding to the respective pixels on the display mode switching layer, which improves the utilization efficiency of light that is emitted out of the display layer. In other words, it is possible to provide the display unit and the electronic apparatus that have the high visibility ensuring suppression of reflected glare of images and deterioration in the luminance.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the present disclosure, and are incorporated in and constitute a part of this specification. The drawings illustrate embodiments and, together with the specification, serve to explain the principles of the present application.

DETAILED DESCRIPTION

Hereinafter, some embodiments of the present disclosure are described in details with reference to the drawings. It is to be noted that the description is provided in the order given below.

1. First Embodiment (an example where an organic layer is used as a display layer, and a display mode switching layer that allows a switchover between a mirror display and a black display to be made is provided)

1-1. Basic Configuration 1-2. Overall Configuration of Display Unit 1-3. Manufacturing Method 1-4. Function and Effects 2. Second Embodiment (a display unit that allows a switchover between a transmissive display and a black display to be made)

3. Third Embodiment (a display unit that allows a switchover between a transmissive display and a mirror display to be made)

4. Modification Examples

Modification Example 1 (an example where a color filter is provided)

Modification Example 2 (an example where a liquid crystal layer is provided as a display layer)

5. Fourth Embodiment (a display unit in which a display mode switching layer is provided in front of a BM layer)
6. Modification Examples
Modification Example 3 (an example where a second electrode on a display mode switching layer is provided to be separated from one another for each pixel)
Modification Example 4 (an example where a first electrode and a second electrode on a display mode switching layer are arranged to intersect with each other)
7. Application Examples (examples of electronic apparatuses)

1. First Embodiment 1-1. Basic Configuration

Figure 1:
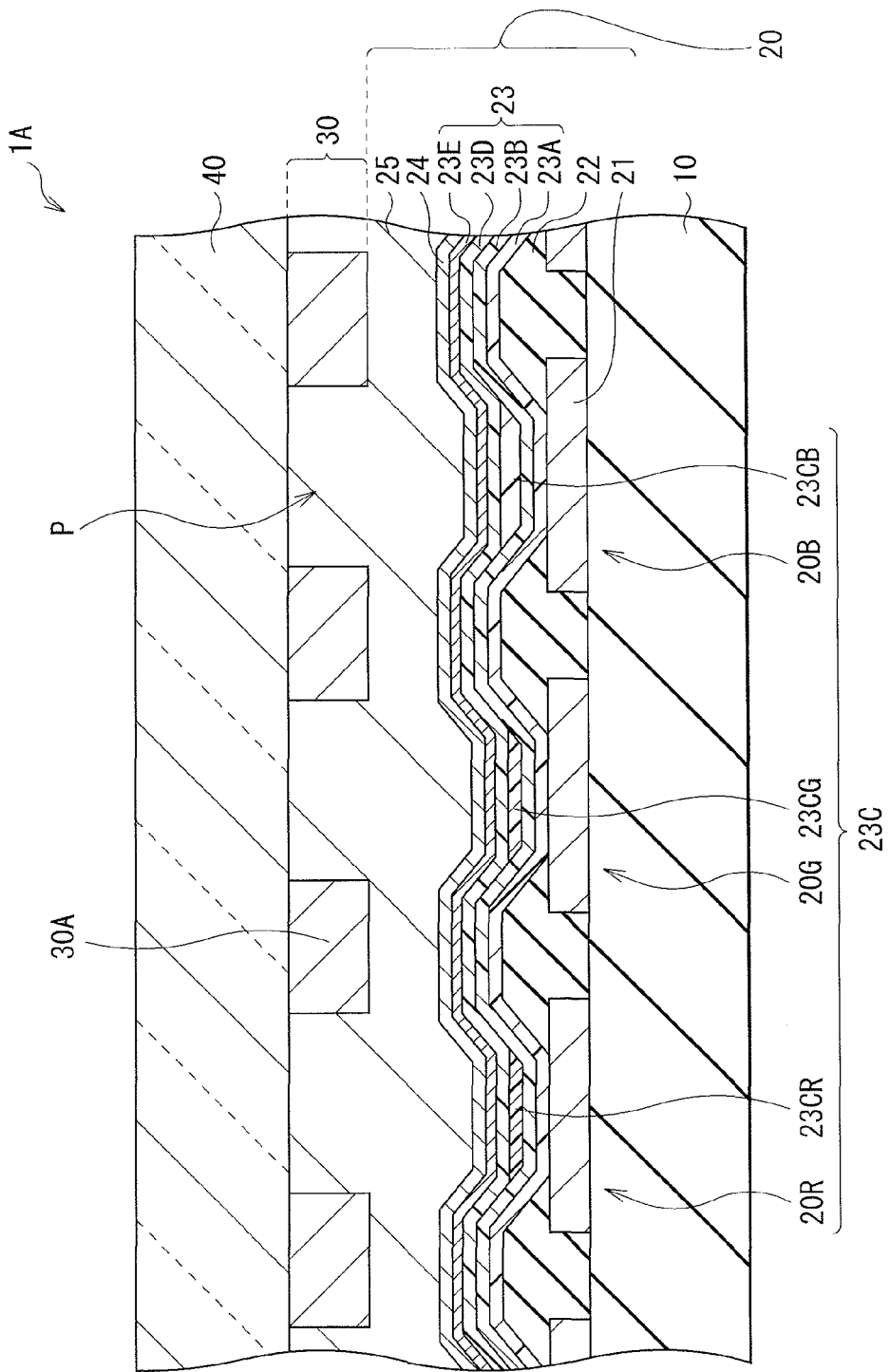
FIG. 1 is a cross-sectional view showing a configuration of a display unit according to a first embodiment of the present disclosure.

FIG. 1 shows a cross-sectional configuration of a display unit (display unit 1A) according to a first embodiment of the present disclosure. This display unit 1A may be used as, for example, a mirror display, a mobile apparatus, or the like, and a display region 110A is provided on a substrate (drive substrate 10) thereof (see FIG. 7). Inside this display region 110A, a plurality of pixels 2 including, for example, a red pixel 2R, a green pixel 2G, and a blue pixel 2B as sub-pixels are arranged in a matrix pattern (see FIG. 2). Each of the pixels 2 (2R, 2G, and 2B) may have, for example, a red light-emitting device 20R to generate red unicolor light, a green light-emitting device 20G to generate green unicolor light, and a blue light-emitting device 20B to generate blue unicolor light that are provided in correspondence with each of the pixels 2. Each of the light-emitting devices 20R, 20G, and 20B may be configured of, for example, an organic EL device to be hereinafter described, or any other devices such as an inorganic EL device, a semiconductor laser, an LED (Light-Emitting Diode), and the like. It is to be noted that each of the drawings including FIG. 1 is a schematic diagram, and thus shapes of a film thickness of each layer and the like do not necessarily conform to actual shapes.

Figure 2:
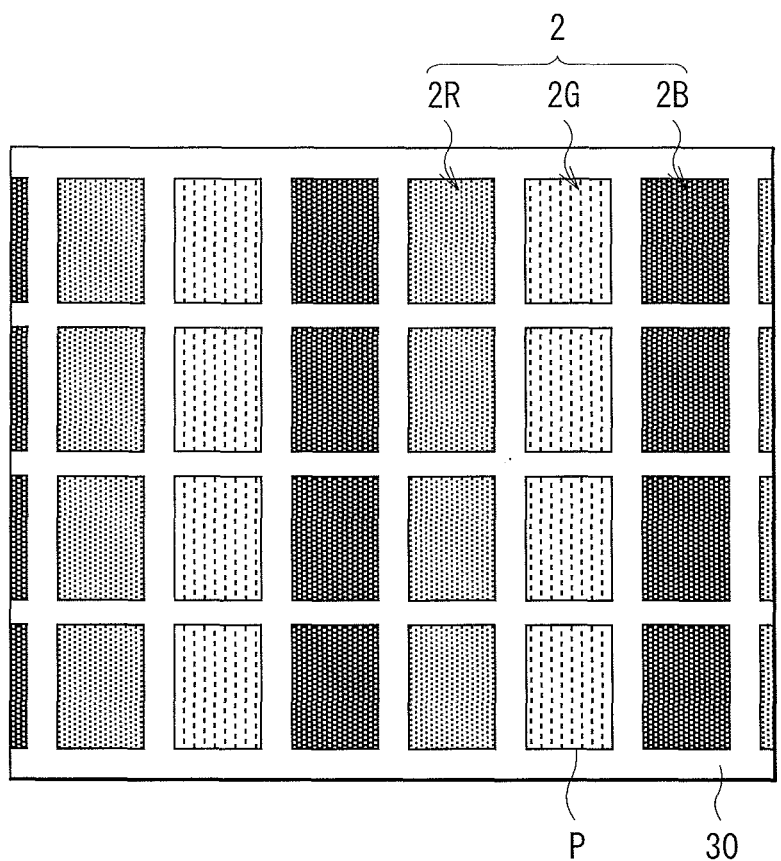
FIG. 2 is a plan view showing an example of a configuration (aperture pattern) of a display mode switching layer in the display unit illustrated in FIG. 1.

In this embodiment of the present disclosure, the drive substrate 10 and a counter substrate 40 seal a display layer 20 on which the light-emitting devices 20R, 20G, and 20B are provided, and a display mode switching layer 30 is provided between the counter substrate 40 and the display layer 20. This display mode switching layer 30 has a function of making a switchover between a mirror display and a black display, for example, and has an aperture P at a position corresponding to each of the pixels 2 (2R, 2G, and 2B). In other words, as shown in FIG. 2, the display mode switching layer 30 is arranged between each of the pixels 2, more specifically, in a lattice-like pattern to surround each of the pixels 2 at a position approximately opposite to a partition wall 22, and such a lattice part changes into a mirror state or a black state (black matrix state).

As described above, the display mode switching layer 30 serves to switch display modes of the display unit 1A between a mirror display (mirror mode) and a black display (display mode), for example. The display mode switching layer 30 allows display modes to be switched optionally as necessary, and may be configured of, for example, a material the optical property of which is changed reversibly by applying a voltage thereto. Examples of such a material may include an electrochromic (EC) material the coloring of which is changed by the use of an oxidation-reduction method, an organic resin, and the like. In this embodiment of the present disclosure, the description is provided by taking as an example a case where the display mode switching layer 30 is configured of an EC device 30A including the EC material.

Figure 3:
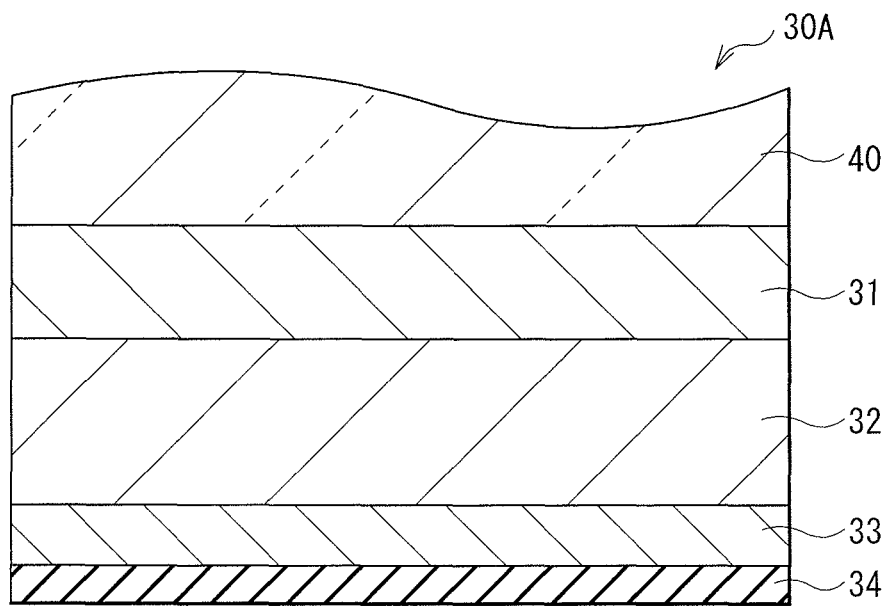
FIG. 3 is a cross-sectional view showing a configuration of the display mode switching layer illustrated in FIG. 2.

FIG. 3 shows a cross-sectional configuration of the display mode switching layer 30. The display mode switching layer 30 is the EC device 30A that is provided on the counter substrate 40, and has a configuration in which a second electrode 31, an EC layer 32, and a first electrode 33 are laminated in this order from the counter substrate 40 side.

The second electrode 31 is configured of a conductive material having the light transmission property (so-called transparent conductive material). Examples of the transparent conductive material may include oxide of indium and tin (ITO), indium zinc oxide (IZO), zinc oxide (ZnO), indium tin zinc oxide (InSnZnO (α-ITZO)), alloy of zinc oxide (ZnO) and aluminum (Al), and the like. The second electrode 31 is formed as a single-layer film made of any one of these materials or a laminated film including two or more kinds of these materials. In addition, carbon nanotube (CNT), graphene, or the like may be used alternatively. A film thickness (hereinafter referred to as simply a thickness) in a laminating direction of the second electrode 31 may be within a range of about 0.2 to 1 μm in a case of, for example, an ITO material.

The EC layer 32 uses an EC material the optical property of which is changed reversibly by applying a voltage thereto as described above, more specifically, the optical property of which is changed into transparent and black colors in this example. A thickness of the EC layer 32 may be preferably within a range of about 0.5 to 2 μm, for example, in consideration of the performance as the display mode switching layer and the viewing angle dependency of the display unit 1A. As a specific configuration example of the EC layer 32, the EC layer 32 may have a configuration in which an ion holding layer 32A, an ion-conducting layer 32B, and a color-developing layer 32C are laminated in this order from the second electrode 31 side (see FIG. 6A).

The ion holding layer 32A may be configured of, for example, nickel oxide (NiO), iridium oxide (α-IrO), iridium tin oxide (IrSnO), tungsten oxide ($WO_3$), polyaniline, copper grid (Cu grid), redox polymer, or the like. A thickness of the ion holding layer 32A may be preferably within a range of about 0.1 to 0.5 μm, for example.

The ion-conducting layer 32B may be configured of, for example, tantalum oxide ($Ta_2O_5$), polymethylmethacrylate resin (PMMA), poly2-acrylamide-2-methyl-1-propanesulfonic acid (Poly-AMPS), copolymer of polyethylene glycol (a-PEO), $SiO_2$/Metal, or the like. A thickness of the ion-conducting layer 32B may be preferably within a range of about 0.1 to 1 μm, for example, in consideration of the capability to supply ion to the color-developing layer 32C and the viewing angle dependency of the display unit 1A.

The color-developing layer 32C is configured of an electrochromic material the color of which is changed from a transparent color into a black color by applying a voltage thereto, such as $WO_3$ and viologen (GENETEX: trademark) in this example. A thickness of the color-developing layer 32C may be preferably within a range of about 0.1 to 1 μm, for example. This ensures that the display mode switching layer 30 switches a display of the display unit 1A from the mirror mode to the display mode. More specifically, the color-developing layer 32C becomes to function as a so-called black matrix (BM) by fully blocking off a mirror surface of the first electrode 33.

The first electrode 33 serves to configure the mirror mode in this embodiment of the present disclosure, and may preferably use a material having the highest possible reflectance. Examples of a material for the lower electrode may include a simple substance or alloy of any of metallic elements, such as aluminum (Al), chromium (Cr), gold (Au), platinum (Pt), nickel (Ni), copper (Cu), tungsten (W), and silver (Ag). The first electrode 33 may have a thickness ensuring that the reflectance as a mirror is fully obtained, and the thickness may be preferably within a range of about 0.1 to 1 µm, for example.

It is to be noted that, on the rear side of the first electrode 33 configuring the mirror mode, that is, on the display layer 20 side, a light-blocking film 34 may be formed as shown in FIG. 3. Formation of the light-blocking film 34 helps to suppress color mixture among the sub-pixels 2R, 2G, and 2B that may be caused because light to be emitted from the light-emitting devices 20R, 20G, and 20B is reflected by the first electrode 33. The light-blocking film 34 may be configured of, for example, a black resin film with optical concentration of 1 or more in which a black coloring agent is mixed, or a thin-film filter utilizing interference of a thin film. A method of configuration by the use of the black resin film may be preferable because this allows the light-blocking film 34 to be formed more inexpensively and easily. The thin-film filter stacks one or more layers of a thin film that may be made of, for example, metal, metallic nitride, or metallic oxide to attenuate light utilizing interference of the thin film. A specific example of the thin-film filter may include a filter stacking Cr and chromium oxide (III) ($Cr_2O_3$) alternately. It is to be noted that the light-blocking film 34 makes a sufficient effect by covering the rear side of the first electrode 33. However, in such a manner that the light-blocking film 34 covers not only the rear side, but also the lateral side, it is possible to further reduce occurrence of color mixture among the sub-pixels 2R, 2G, and 2B.

It is to be noted that the light-blocking film 34 is not strictly necessary, and may be omitted in a case where multiple reflection does not have an influence on other pixels 2R, 2G, and 2B from a relationship of a gap between a light-emitting layer 23C and a color filter (the display mode switching layer 30 in this case), a size of the aperture P, and an aperture pitch. This makes it possible to utilize light from a light source (the light-emitting devices 20R, 20G, and 20B in this case) more efficiently.

Alternatively, AR (Anti Reflect) treatment may be performed for the rear side of the first electrode 33 instead of use of the light-blocking film 34. As with the case where the light-blocking film 34 is formed, this reduces reflection of light onto the rear side of the first electrode 33, which makes it possible to prevent color mixture among the sub-pixels 2R, 2G, and 2B.

Figure 4A:
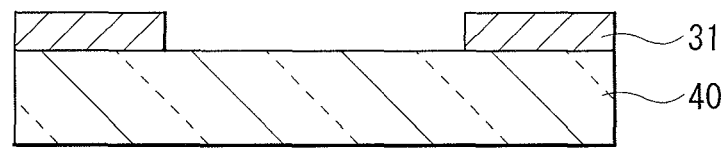
FIG. 4A is a cross-sectional view for explaining an example of a method of manufacturing the display mode switching layer illustrated in FIG. 2.
Figure 4B:
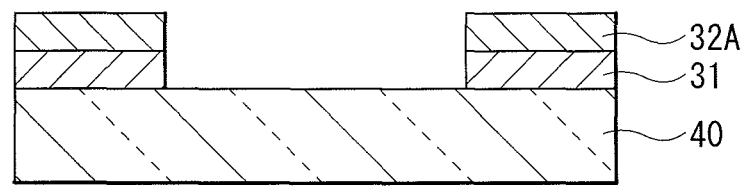
FIG. 4B is a cross-sectional view showing a process following on the process shown in FIG. 4A.

Such a display mode switching layer 30 may be manufactured in the following manner, for example. First, as shown in FIG. 4A, the second electrode 31 is formed on the counter substrate 40 by forming, for example, an ITO film using a vapor-deposition technique such as a sputtering method, and thereafter by patterning such a film in a desired shape (lattice-like shape in this example) using, for example, a photolithographic approach. Next, as shown in FIG. 4B, the ion holding layer 32A is formed on the second electrode 31 by forming an NiO film on the counter substrate 40 and the second electrode 31 using a sputtering method, and thereafter by patterning such a film using a dry etching method.

Figure 4C:
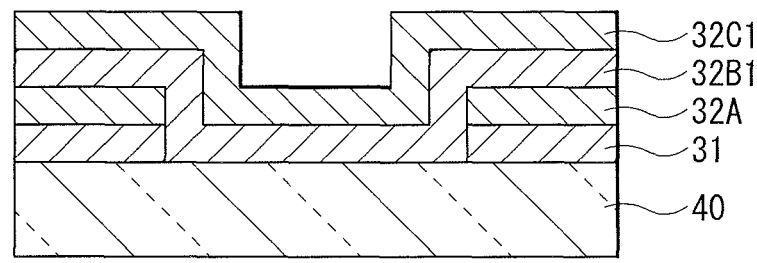
FIG. 4C is a cross-sectional view showing a process following on the process shown in FIG. 4B.

Next, as shown in FIG. 4C, a $Ta_2O_5$ film (32B1) is formed on the counter substrate 40 and the ion holding layer 32A using, for example, the sputtering method, and then a $WO_3$ film (32C1) is formed on this $Ta_2O_5$ film. Thereafter, the ion-conducting layer 32B and the color-developing layer 32C are formed by patterning the $Ta_2O_5$ film (32B1) and the $WO_3$ film (32C1) using a dry etching method by the use of gas such as $CF_4$.

Figure 5A:
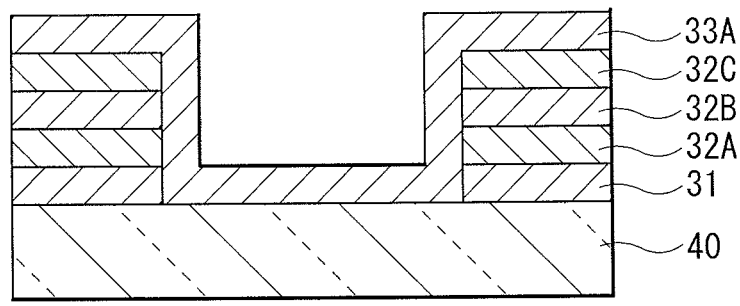
FIG. 5A is a cross-sectional view showing a process following on the process shown in FIG. 4C.
Figure 5B:
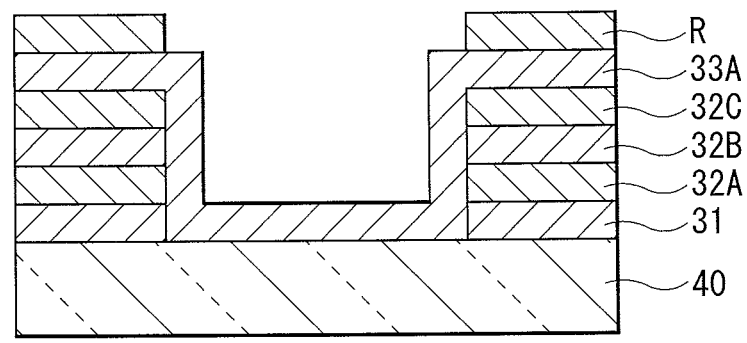
FIG. 5B is a cross-sectional view showing a process following on the process shown in FIG. 5A.
Figure 5C:
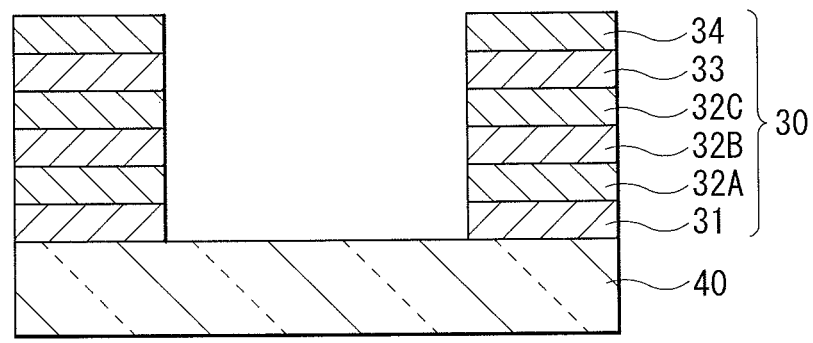
FIG. 5C is a cross-sectional view showing a process following on the process shown in FIG. 5B.

Subsequently, as shown in FIG. 5A, for example, an Al film (33A) is formed across an area from the top surface of the color-developing layer 32C to the counter substrate 40 using, for example, the sputtering method. Thereafter, as shown in FIG. 5B, the Al film (33A) is patterned in a predetermined shape by performing the exposure and development after coating a resist R for the black matrix, for example, on the Al film (33A). Finally, as shown in FIG. 5C, the first electrode 33 is formed in a manner of performing the dry etching by the use of gas such as $Cl_2$ for the Al film (33A) to bring the display mode switching layer 30 to completion. It is to be noted that the resist R is usable as the light-blocking film 34 by leaving the resist R on the first electrode 33 as it is.

Figure 6A:
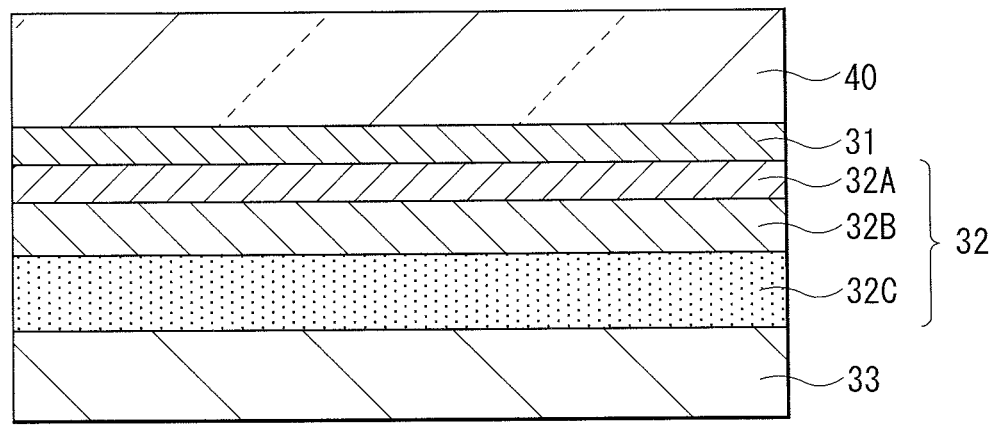
FIG. 6A is a cross-sectional view of the display mode switching layer illustrated in FIG. 2 for explaining display modes.
Figure 6B:
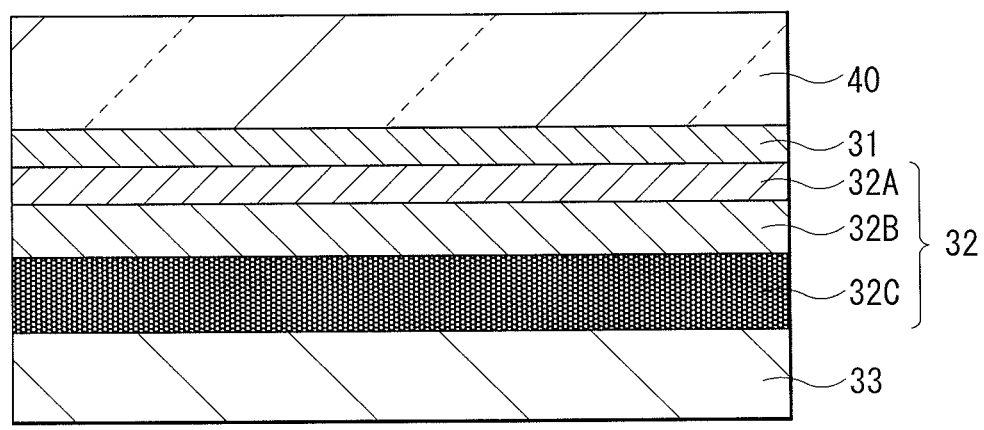
FIG. 6B is a cross-sectional view of the display mode switching layer illustrated in FIG. 2 for explaining display modes.

Each of FIG. 6A and FIG. 6B schematically shows a change in a color state of the display mode switching layer 30. It is assumed that each EC layer 32 (32A, 32B, and 32C) is configured of NiO (ion holding layer 32A), $Ta_2O_3$ (ion-conducting layer 32B), and $WO_3$ (color-developing layer 32C). In the display mode switching layer 30 that is configured in such a manner, $WO_3$ in the color-developing layer 32C exists in a colorless ($WO_3$) state as shown in FIG. 6A in a state where a positive (+) voltage is applied to the first electrode 33, and a negative (−) voltage is applied to the second electrode 31, for example. Therefore, the display unit 1A is put in a state where a metallic film (for example, Al) that configures the first electrode 33 is visible, that is, a mirror mode. On the other hand, when a reverse polarity voltage is applied to each of these electrodes, more specifically, when a negative (−) voltage is applied to the first electrode 33, and a positive (+) voltage is applied to the second electrode 31, ion ($H^+$) contained in the ion holding layer 32A is supplied to the color-developing layer 32C via the ion-conducting layer 32B, resulting in $WO_3$ in the color-developing layer 32C being reduced into $H_xWO_3$. As shown in FIG. 6B, this puts the color-developing layer 32C in a black state ($H_xWO_3$). The display mode switching layer 30 that turns black functions as a so-called black matrix (BM), and thus the display unit 1A is put in a display mode in which it functions as a typical display unit. In other words, the image display is achieved that prevents a reflected glare of an object from being cast on the display region 110A.

1-2. Overall Configuration of Display Unit

Figure 7:
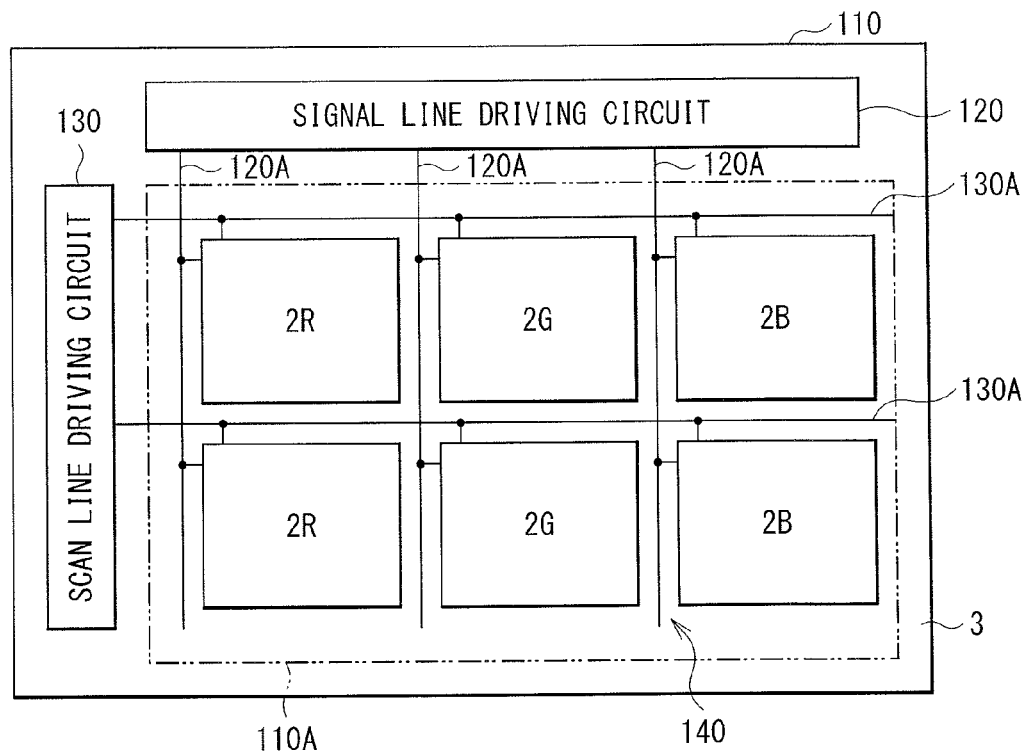
FIG. 7 is a schematic block diagram showing an overall configuration of the display unit illustrated in FIG. 1.

FIG. 7 shows an overall configuration of the display unit 1A. As described above, the display unit 1A is a display unit of a top surface emission type (so-called top-emission type) in which the display region 110A is provided on the drive substrate 10, and display devices that emit any of color light of R (red), G (green), and B (blue) from the top surface side (surface on the opposite side of the substrate 10), more specifically in this case, a plurality of organic EL devices (light-emitting devices 20) are provided in this display region 110A. In a peripheral region 110B that is located in a periphery of the display region 110A (outer edge side and outer circumference side), a signal line driving circuit 120 and a scan line driving circuit 130 are arranged that serve as drivers for image display.

Figure 8:
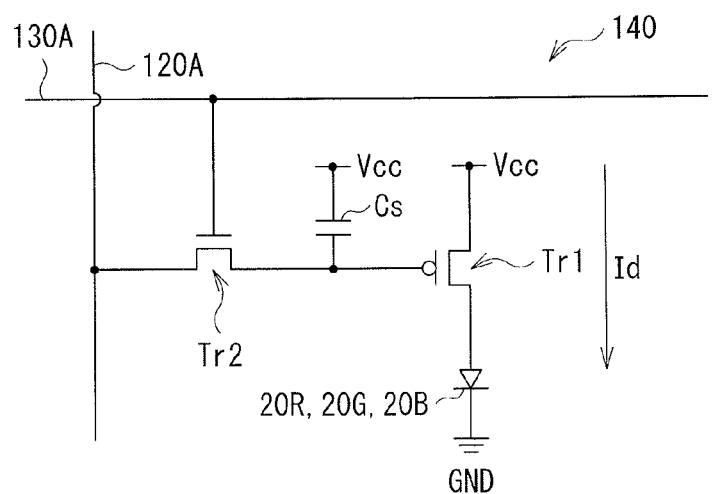
FIG. 8 is a circuit diagram showing an example of a pixel driving circuit illustrated in FIG. 7.

Inside the display region 110A, there is provided a pixel driving circuit 140. FIG. 8 shows an example of this pixel driving circuit 140 (an example of a pixel circuit for each of the red pixel 2R, the green pixel 2G, and the blue pixel 2B). The pixel driving circuit 140 is an active-type driving circuit that is formed on an underlayer of a pixel electrode 31 to be hereinafter described. This pixel driving circuit 140 has a driving transistor Tr1 and a writing transistor Tr2, as well as a capacitor (storage capacitor) Cs between these transistors Tr1 and Tr2. Further, the pixel driving circuit 140 also has the light-emitting device 20 that is connected in series with the driving transistor Tr1 between a first power line (Vcc) and a second power line (GND). In other words, in each of the red pixel 2R, the green pixel 2G, and the blue pixel 2B, the light-emitting device 20 (any one of the red light-emitting device 20R, the green light-emitting device 20G, and the blue light-emitting device 20B) is provided in correspondence with each of these pixels. Each of the driving transistor Tr1 and the writing transistor Tr2 is configured of a typical TFT (Thin-Film Transistor), and a configuration thereof is not limited specifically. That is, the configuration may adopt, for example, an inversely-staggered structure (so-called bottom-gate type) or a staggered structure (top-gate type).

In the pixel driving circuit 140, a plurality of signal lines 120A are arranged in a column direction, and a plurality of scan lines 130A are arranged in a row direction. A crosspoint each of the signal lines 120A and the scan lines 130A corresponds to any one of the red pixel 2R, the green pixel 2G, and the blue pixel 2B. Each of the signal lines 120A is connected with the signal line driving circuit 120, and an image signal is provided to a source electrode of the writing transistor Tr2 via the signal line 120A from the signal line driving circuit 120. Each of the scan lines 130A is connected with the scan line driving circuit 130, and scan signals are sequentially provided to a gate electrode of the writing transistor Tr2 via the scan line 130A from the scan line driving circuit 130.

As shown in FIG. 1, in each of the light-emitting devices 20R, 20G, and 20B, a lower electrode 21 as an anode, a partition wall 22, an organic layer 23 including a light-emitting layer 23C, and an upper electrode 24 as a cathode are laminated in this order from the drive substrate 10 side on which the driving transistor Tr1 in the above-described pixel driving circuit 140 and a planarizing insulating film (not shown in the drawing) are provided. The driving transistor Tr1 is electrically connected with the lower electrode 21 via a connection hole (not shown in the drawing) that is provided on the planarizing insulating film.

Each of such light-emitting devices 20R, 20G, and 20B is covered by a planarizing layer 25. Further, on top of the planarizing layer 25, the counter substrate 40 on which the above-described display mode switching layer 30 is provided is bonded from the display mode switching layer 30 side with, for example, an adhesive layer (not shown in the drawing) in between. It is to be noted that the aperture P of the display mode switching layer 30 is provided on each of the sub-pixels 2R, 2G, and 2B, that is, on each of the light-emitting devices 20R, 20G, and 20B, and the display mode switching layer 30 is provided at a position facing the partition wall 22.

The lower electrode 21 has a function as a reflective layer as well, and may preferably have the highest possible reflectance to raise the luminescence efficiency. In particular, when the lower electrode 21 is used as an anode, the lower electrode 21 may be preferably configured of a material having the improved hole-injecting property. Examples of a material for such a lower electrode 21 may include a simple substance or alloy of any of metallic elements, such as Cr, Au, Pt, Ni, Cu, W, and Ag with a thickness in a laminating direction of at least about 100 nm but no more than about 1000 nm. On a surface of the lower electrode 21, a transparent conductive film that is made of a material such as ITO may be provided. It is to be noted that even a material like an Al alloy which may pose a disadvantage to a hole injection barrier due to the presence of an oxidized film on a surface and an insignificant work function in spite of high reflectance is usable for the lower electrode 21 by providing a proper hole injection layer.

The partition wall 22 assures the insulating property between the lower electrode 21 and the upper electrode 24, as well as to form a light emission region in a desired shape. Further, the partition wall 22 also has a function as a partition in carrying out coating by the use of, for example, an ink jet or nozzle coating method in a manufacturing process to be hereinafter described. The partition wall 22 may have a structure in which an upper partition wall that is made of photosensitive resin, such as positive photosensitive polybenzoxazole and positive photosensitive polyimide is formed on a lower partition wall that is made of an inorganic insulating material such as $SiO_2$. The partition wall 22 is provided with an aperture corresponding to a light emission region. It is to be noted that the organic layer 23 and the upper electrode 24 may be provided not only on the aperture, but also on the partition wall 22. However, it is only in the aperture of the partition wall 22 that produces luminescence.

For example, the organic layer 23 may have a configuration in which a hole injection layer 23A, a hole transport layer 23B, a light-emitting layer 23C, an electron transport layer 23D, and an electron injection layer 23E are laminated in this order from the lower electrode 21 side. Any layers other than the light-emitting layer 23C among these layers may be provided as necessary. The organic layer 23 may be configured differently depending on a luminescent color of each of the light-emitting devices 20R, 20G, and 20B. The hole injection layer 23A is a buffer layer for improving the hole injection efficiency and for preventing leakage. The hole transport layer 23B serves to improve the hole transport efficiency for the light-emitting layer 23C. The light-emitting layer 23C produces recombination of electrons and holes by application of an electric field to generate light. The electron transport layer 23D improves the electron transport efficiency for the light-emitting layer 23C. The electron injection layer 23E serves to improve the electron injection efficiency.

The hole injection layer 23A of the light-emitting device 20R may be, for example, at least about 5 nm but no more than about 300 nm in thickness, and may be configured of, for example, a hexaazatriphenylene derivative. The hole transport layer 23B of the light-emitting device 20R may be, for example, at least about 5 nm but no more than about 300 nm in thickness, and may be configured of, for example, bis[(N-naphthyl)-N-phenyl]benzidine (α-NPD). The light-emitting layer 23C of the light-emitting device 20R may be, for example, at least about 10 nm but no more than about 100 nm in thickness, and may be configured of, for example, a material mixing 2,6-bis[4-[N-(4-methoxyphenyl)-N-phenyl]aminostyryl]naphthalene-1,5-dicarbonitryl (BSN-BCN) with 8-quinolinol aluminum complex (Alq3) at a volume ratio of about 40%. The electron transport layer 23D of the light-emitting device 20R may be, for example, at least about 5 nm but no more than about 300 nm in thickness, and may be configured of, for example, Alq3. The electron injection layer 23E of the light-emitting device 20R may be, for example, about 0.3 nm in thickness, and may be configured of, for example, a material such as LiF and $Li_2O$.

The upper electrode 24 may be, for example, about 10 nm in thickness, and may be configured of, for example, an alloy of Al, magnesium (Mg), calcium (Ca), or sodium (Na).

Above all, Mg—Ag alloy may be preferable because it combines the conductivity and reduced absorption in a thin film. A ratio of Mg to Ag in the Mg—Ag alloy is not limited specifically, but a film thickness ratio of Mg to Ag may be preferably within a range of about 0:1 to 1:1. Alternatively, a material for the upper electrode 24 may be also an alloy (Al—Li alloy) of aluminum (Al) and lithium (Li).

Further, the upper electrode 24 may also combine a function as a semi-transmissive reflective layer. When the upper electrode 24 has a function as the semi-transmissive reflective layer, the light-emitting device 20R has a resonator structure, and resonates light generated by the light-emitting layer 23C between the lower electrode 21 and the upper electrode 24 with help of this resonator structure. This resonator structure resonates the light generated by the light-emitting layer 23C to extract the resultant light from the semi-transmissive reflective surface side in such a manner that an interface between the lower electrode 21 and the organic layer 23 is served as a reflective surface, an interface between an intermediate layer (not shown in the drawing) and the electron injection layer 23E is served as a semi-transmissive reflective surface, and the organic layer 23 is served as a resonant section. Such a configuration having the resonator structure brings multiple interference of the light generated by the light-emitting layer 23C, and decreases a half-value width of a spectrum of the light extracted from the semi-transmissive reflective surface side, which allows a peak intensity to be raised. In other words, this makes it possible to raise the light emission intensity in a front direction, as well as to enhance the light-emitting color purity.

The planarizing layer 25 is configured of a material, such as silicon nitride (SiNx), silicon oxide (SiOx), or metal oxide. The adhesive layer is configured of a material, such as a thermosetting resin or an ultraviolet-curing resin.

The counter substrate 40 seals the light-emitting devices 20R, 20G, and 20B together with the adhesive layer. Like this embodiment of the present disclosure, in a top-emission type that extracts light from the counter substrate 40 side, the counter substrate 40 is configured of a material such as glass that is transparent to the light emitted from each of the light-emitting devices 20R, 20G, and 20B. In the present embodiment, the counter substrate 40 is provided with the display mode switching layer 30 as described above. It is to be noted that a bottom surface emission type (so-called bottom-emission type) that extracts light from the drive substrate 10 side does not call for the transparency of the counter substrate 40 for visible light.

1-3. Manufacturing Method

The display unit 1A may be manufactured in the following manner, for example. First, the pixel driving circuit 140, the signal line driving circuit 120, the scan line driving circuit 130, and the like are arranged on a substrate made of a material such as glass to form the drive substrate 10. Next, a metallic film such as an Al alloy film is formed using, for example, a sputtering method, and subsequently the metallic film is removed selectively using a wet etching method and the like to form the lower electrode 21 that is separated for each of the light-emitting devices 20R, 20G, and 20B. Thereafter, photosensitive resin is coated over a whole surface of the drive substrate 10, and then an aperture corresponding to a light emission region is provided using a photolithographic approach to form the partition wall 22 using a baking treatment.

Next, the hole injection layer 23A and the hole transport layer 23B that are made of the above-described materials with the above-described thicknesses are formed on the lower electrode 21 and the partition wall 22 using a coating method, such as a spin coating method or a droplet method. Subsequently, a red light-emitting layer 23CR, a green light-emitting layer 23CG, and a blue light-emitting layer 23CB are formed at each of corresponding positions using a droplet discharging method, such as a spin coating method or an ink jet method, and the like. Thereafter, the electron transport layer 23D and the electron injection layer 23E that are made of the above-described materials with the above-described thicknesses are formed on the hole transport layer 23B and each of the light-emitting layers 23C using a coating method, such as a spin coating method or a droplet method. Afterward, for example, an ITO film is formed over a whole surface of the electron injection layer 23E using, for example, a vapor-deposition technique to be served as the upper electrode 24. Such a process forms the light-emitting devices 20R, 20G, and 20B.

Subsequently, the planarizing layer 25 that is made of the above-described material is formed on each of the light-emitting devices 20R, 20G, and 20B using, for example, a CVD method or a sputtering method. Thereafter, the counter substrate 40 on which the display mode switching layer 30 is arranged is bonded on the planarizing layer 25 with the adhesive layer in between. The steps described thus far brings the display unit 1A illustrated in FIG. 1 to completion.

In this display unit 1A, a scan signal is provided to each of the pixels 2 from the scan line driving circuit 130 via a gate electrode of the writing transistor Tr2, and an image signal from the signal line driving circuit 120 is stored on the storage capacitor Cs via the writing transistor Tr2. More specifically, on-off control of the driving transistor Tr1 is performed depending on a signal stored on the storage capacitor Cs. This injects a drive current Id into each of the light-emitting devices 20R, 20G, and 20B, which causes holes and electrons to recombine, leading to luminescence being produced. For example, this light may be multiply-reflected between the lower electrode 21 and the upper electrode 24, or the reflected light in the lower electrode 21 and the light generated by the light-emitting layer 23C may be intensified by interfering with each other. Thereafter, this light is transmitted through the upper electrode 24 and the counter substrate 40 to be extracted.

1-4. Function and Effects

As a mirror display, a configuration may be contemplated that arranges a half-mirror sheet on the near side of the display device, more specifically, for example, in front of a glass substrate (on the display surface side), such as the counter substrate 40 in this embodiment of the present disclosure. However, the half-mirror sheet has low reflectance, and thus it is difficult to achieve the satisfactory function as a mirror. Further, since the half-mirror sheet is arranged over a whole area of the display surface, it is likely that displayed images will be blocked by the half-mirror sheet to be made blurred, and the luminance will be deteriorated as a possible issue. Such deterioration in the luminance may be improved by enhancing the luminescence intensity of the light-emitting device, but a disadvantage of an increase in power consumption may be caused.

On the other hand, a display unit may be contemplated that adopts a configuration where in the inside of the display device, for example, between a glass substrate and a layer having a color filter and a black matrix that is provided on this glass substrate, a metallic layer with high reflectance is arranged over a whole surface of the glass substrate. However, in such a display unit, a display surface (display region) is put in a mirror state at all times, and thus it is likely that a reflected glare will be cast on a mirror, which may make images less visible as a possible issue.

On the contrary, in this embodiment of the present disclosure, between the display layer 20 and the counter substrate 40, there is provided the display mode switching layer 30 that is configured of the EC device 30A and that has the aperture P on each of the light-emitting devices 20R, 20G, and 20B. The EC device 30A has a configuration in which the EC layer 32, including an EC material that produces color development of transparent and black colors reversibly by application of a voltage, is sealed between the second electrode 31 that is formed of a transparent conductive material and the first electrode 33 that is formed of a metallic material having high reflectance. It is to be noted that, for each of the layers 31, 32, and 33 of the display mode switching layer 30, the second electrode 33, the EC layer 32, and the first electrode 31 are laminated in this order from the display surface side, that is, the counter substrate 40 side. Consequently, when the EC layer 32 is put in a transparent state, a display mode of the display unit 1A is placed in a mirror display (mirror mode) in which the first electrode 31 that is formed of a metallic material having high reflectance is seen through. On the other hand, when the EC layer 32 exhibits a black color, the first electrode 31 is put in a state of being blocked by the EC material. At this time, when each of the light-emitting devices 20R, 20G, and 20B is being driven to display images on the display surface, the EC layer 32 functions as the BM that is provided on a typical display unit, which makes it possible to perform the image display (display mode) without any reflected glare cast on the display surface.

Table 1 summarizes display modes of the display unit 1A at the time when the display mode switching layer 30 and each of the light-emitting devices 20R, 20G, and 20B are put in an on-state and an off-state. In the display unit 1A according to this embodiment of the present disclosure, it is possible to use, on an as-appropriate basis, three modes including a mirror mode functioning as a mirror, a display mode functioning as a typical display unit, and a combination of the mirror mode and the display mode that allows a mirror image and a display image to be overlaid for use. Such a changeover of the display modes may be carried out using an input signal from a remote controller and the like as a trigger, for example.

TABLE 1

| Display mode switching layer | | Light-emitting | |
| --- | --- | --- | --- |
| First electrode | Second electrode | device | Display modes |
| Negative | Positive | Off | Mirror mode |
| Positive | Negative | On | Display mode |
| Negative | Positive | On | Mirror mode and display mode |

Figure 9:
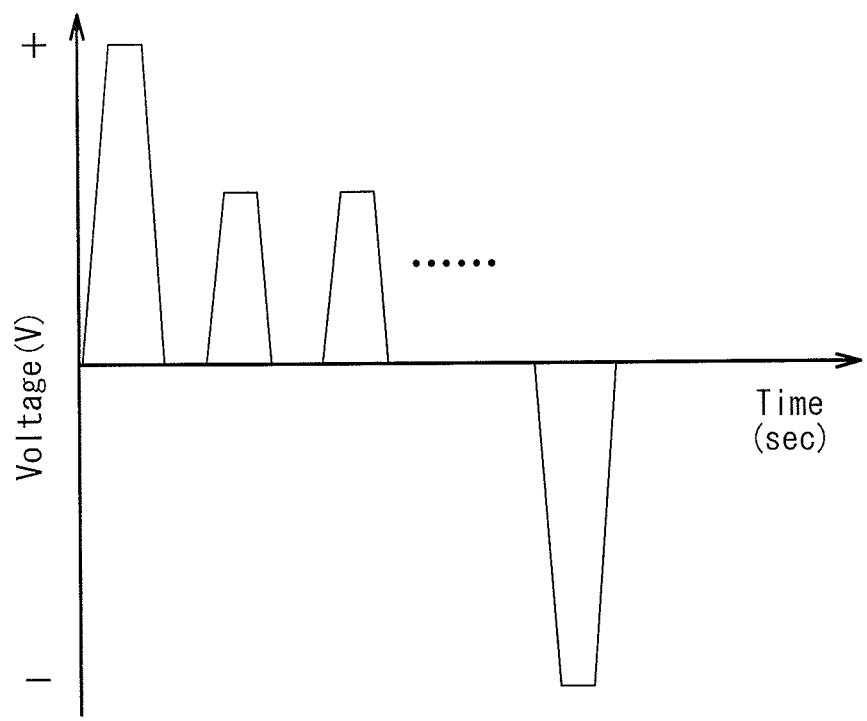
FIG. 9 is a waveform chart showing a waveform example of a voltage applied to the display mode switching layer.

FIG. 9 shows a waveform example in driving the display mode switching layer 30. When the display unit 1A is used as a mirror display, a quick changeover between the mirror mode and the display mode is desired. To achieve this, to start with, for example, a high voltage of about 1 to 10 V (a positive (+) voltage is applied to the second electrode 31, and a negative (−) voltage is applied to the first electrode 33) may be applied for about 1 to 20 seconds, for example. As a result, for example, $WO_3$ in the color-developing layer 32C is reduced into $HWO_3$ to exhibit a black color, and the display unit 1A is switched from the mirror mode to the display mode. After switching to the display mode, a low voltage of about 1 to 5 V, for example, may be applied periodically (for example, at intervals of about 10 seconds or less) to keep the black display of the EC layer 32. When the mode is switched back from the display mode to the mirror mode, a voltage that is reverse to the above-described voltage in polarity (a negative (−) voltage is applied to the second electrode 31, and a positive (+) voltage is applied to the first electrode 33) may be applied for about 10 seconds, for example. As a result, $HWO_3$ in the color-developing layer 32C is oxidized into $WO_3$ to become colorless (transparent), and a mirror surface of the first electrode 33 becomes visible.

It is to be noted that the mirror mode that is switched from the display mode is maintained without applying a voltage. Further, the above-described voltage values are denoted as an example, and may vary as appropriate depending on a device structure. In addition, the response speed may also vary depending on a size of a display panel.

Figure 10:
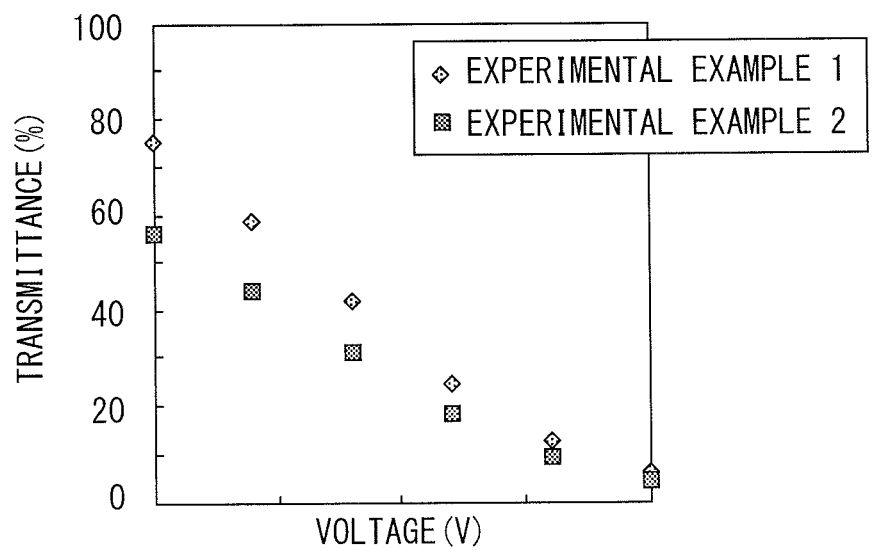
FIG. 10 is a characteristic diagram showing a relationship between reflectance and voltage in experimental examples 1 and 2 according to one embodiment of the present disclosure.

FIG. 10 shows variations in the reflectance of the display surface in a case where the aperture P was not formed on each of the light-emitting devices 20R, 20G, and 20B on the display mode switching layer 30 (no aperture was provided: experimental example 1) and in a case where the aperture P was formed (the aperture was provided: experimental example 2). In the experimental example 2, the highest reflectance of the display surface in the mirror mode was lower (about 60%) because of provision of the aperture P as compared with the experimental example 1 where the aperture P was not provided, but it is possible to extract light emitted by the light-emitting device 20 from the aperture P. Hence, it is possible for the experimental example 2 to display less degraded, clearer images as compared with those in the experimental example 1. Further, from both of the experimental examples 1 and 2, it is seen that each of the display mode switching layer 30 (with the aperture) and a display mode switching layer 90 (without the aperture) to be hereinafter described has a reflectance adjustment function capable of adjusting the reflectance depending on a magnitude of a voltage to be applied.

Therefore, in the display unit 1A according to this embodiment of the present disclosure, the display mode switching layer 30 is provided between the display layer 20 and the counter substrate 40. This display mode switching layer 30 is configured using a material the optical property of which changes reversibly, and thus it is possible to switch the display unit 1A optionally as necessary between the mirror mode having a satisfactory function as a mirror and the display mode that prevents a reflected glare of images from being cast on the display surface. Further, the apertures P are provided at positions corresponding to the respective light-emitting devices 20R, 20G, and 20B on the display mode switching layer 30, which makes it possible to suppress deterioration in the luminance, as well as to display high-definition and clear images. In other words, it is possible to provide the display unit having the high visibility, and the electronic apparatus that includes such a display unit.

Figure 11:
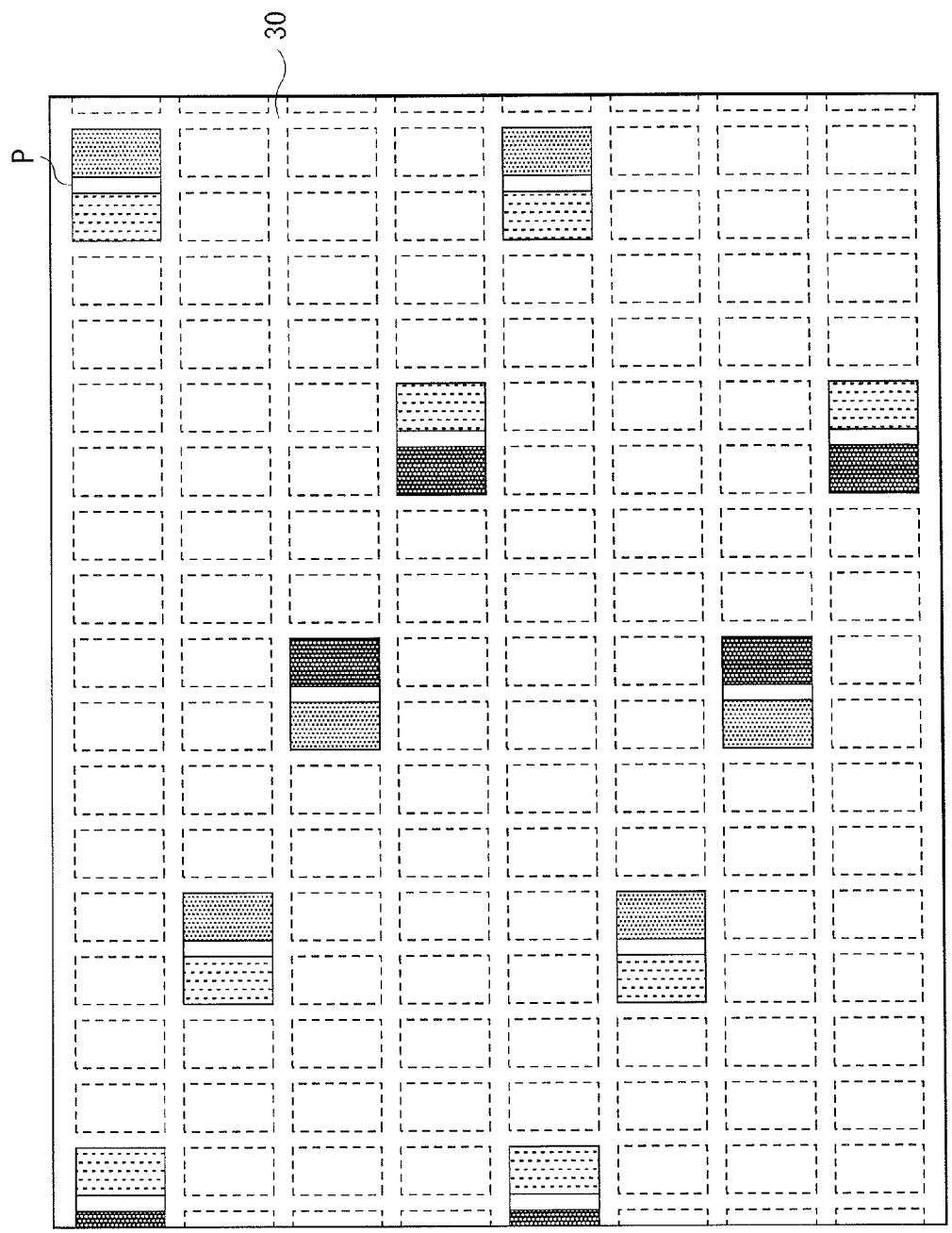
FIG. 11 is a plan view showing another example of an aperture pattern of the display mode switching layer in the display unit illustrated in FIG. 1.

It is to be noted that, in this embodiment of the present disclosure, the display mode switching layer 30 is patterned in a lattice-like shape (lattice pattern) having an aperture for each of the sub-pixels 2R, 2G, and 2B, but it is not limited thereto. For example, when moire is caused due to an aperture pitch or a frequency of light emitted by each of the light-emitting devices 20R, 20G, and 20B, the lattice pattern may be formed in such a manner that the aperture P is provided for each of two adjacent sub-pixels (for example, red pixel 2R and green pixel 2G, green pixel 2G and blue pixel 2B, and the like) as shown in an example in FIG. 11.

Further, in this embodiment of the present disclosure, the light-emitting devices 20R, 20G, and 20B that emit red emission light, green emission light, and blue emission light respectively are formed as the light-emitting devices, which allows the display unit having the wider color gamut to be configured. In addition, a color filter is not necessary, and thus it is possible to achieve the higher luminance.

Hereinafter, the description is provided on second to fourth embodiments and modification examples 1 to 4. Any component parts which are the same as those in the first embodiment are denoted with the same reference numerals, and the description is omitted as appropriate.

2. Second Embodiment

Figure 12:
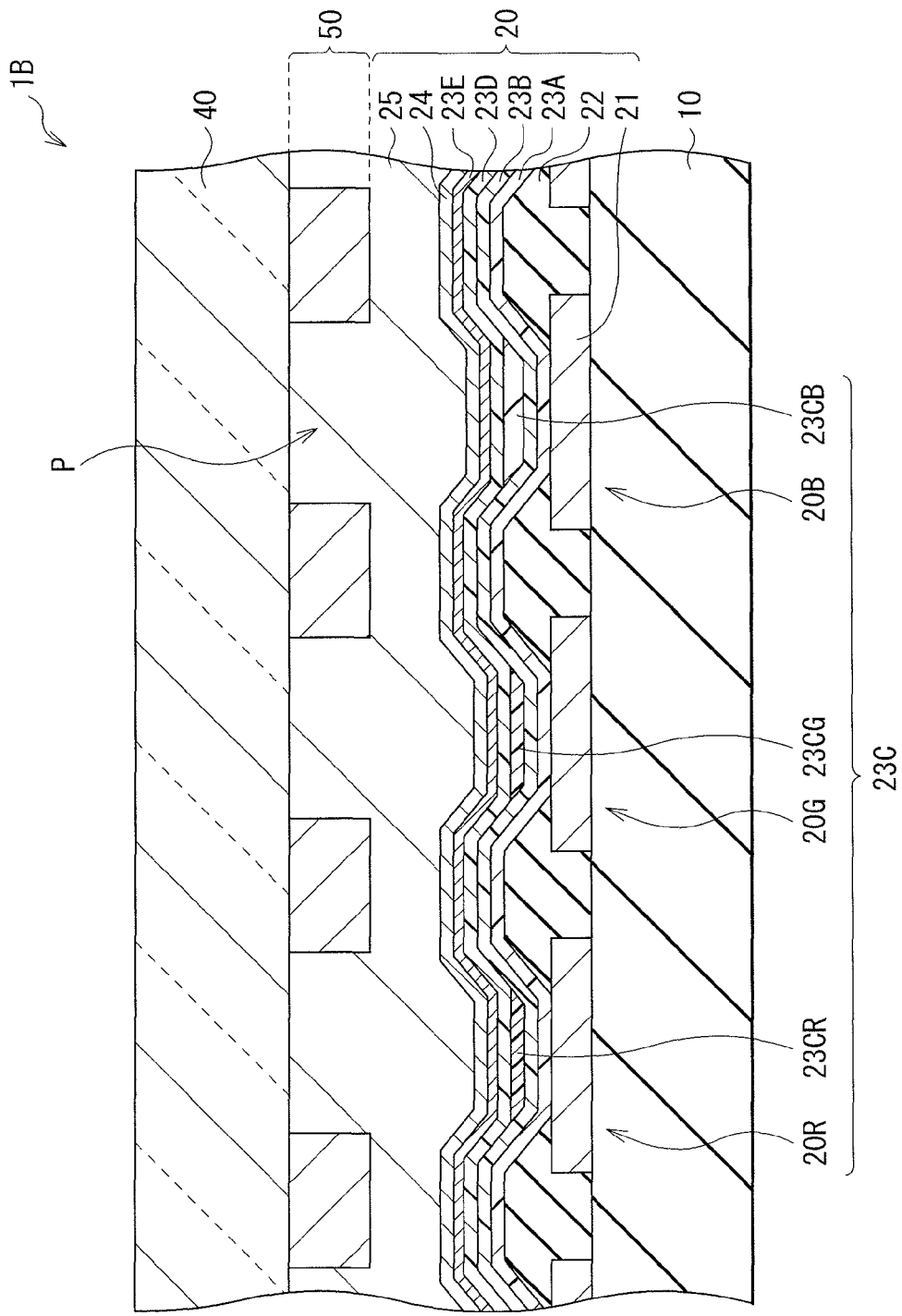
FIG. 12 is a cross-sectional view showing a configuration of a display unit according to a second embodiment of the present disclosure.

FIG. 12 shows a cross-sectional configuration of a display unit 1B according to a second embodiment of the present disclosure. As with the above-described first embodiment, in this display unit 1B, a display mode switching layer 50 is provided between the display layer 20 and the counter substrate 40. However, this embodiment is different from the above-described first embodiment in that the display mode switching layer 50 allows a changeover between a transmissive display (transmissive display mode) and a black display (display mode) to be made.

Figure 13:
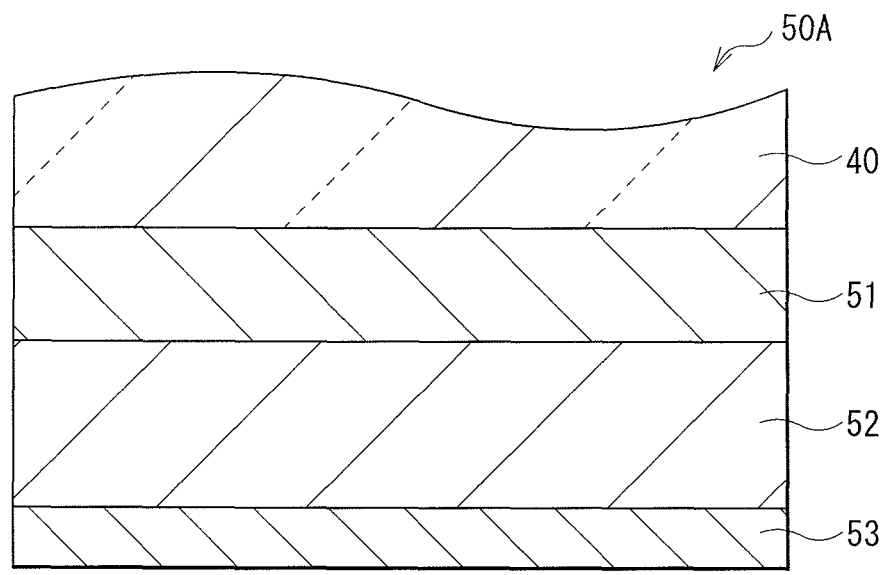
FIG. 13 is a cross-sectional view showing a configuration of a display mode switching layer in the display unit illustrated in FIG. 12.

As described above, the display mode switching layer 50 switches a display mode of the display unit 1B between the transmissive display mode and the display mode, and is configured of an EC device 50A having a laminated structure similar to that in the above-described first embodiment as shown in FIG. 13. However, in this embodiment, a first electrode 53 as well as a second electrode 51 is formed of a transparent conductive material. Specific examples of such a material may include ITO, IZO, ZnO, InSnZnO ($\alpha$-ITZO), and alloy of ZnO and Al, and each of the first electrode 53 and the second electrode 51 is configured of a single-layer film using any one of these conductive materials or a laminated film including two or more kinds of these conductive materials. Alternatively, CNT, graphene, and the like may be used. It is to be noted that an EC layer 52 is allowed to be formed using the configuration and materials similar to those in the first embodiment.

Figure 14:
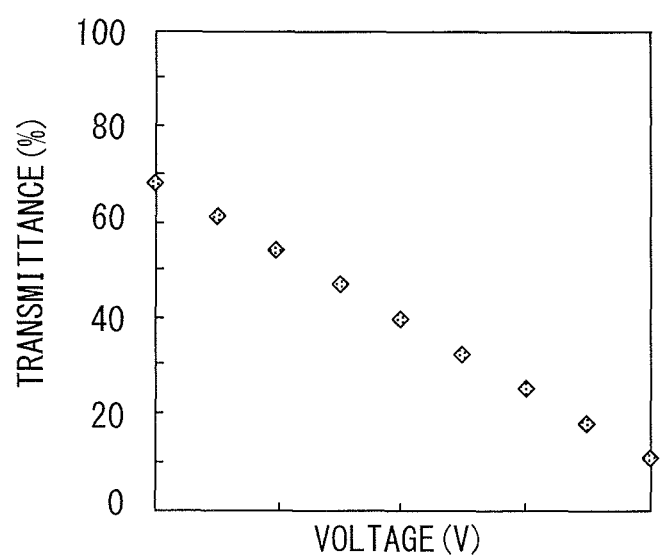
FIG. 14 is a characteristic diagram showing a relationship between reflectance and voltage in an experimental example 3 according to one embodiment of the present disclosure.

FIG. 14 shows the optical absorption characteristics (transmittance) at each voltage of the display mode switching layer 50 in this embodiment (experimental example 3). It is seen from FIG. 14 that the transmittance of the EC layer varied with changes in a magnitude of a voltage applied. More specifically, for example, as shown in FIG. 9, it is seen that switching between the transmissive display mode and the display mode (non-transmissive display mode) may be performed by applying a negative (−) voltage or a positive (+) voltage to each of the first electrode 53 and the second electrode 51.

As described above, in this embodiment of the present disclosure, each of the first electrode 53 and the second electrode 51 of the display mode switching layer 50 is formed using a transparent conductive film, which makes it possible to switch a display mode of the display unit 1B between the transmissive display mode and the display mode as necessary.

Further, as seen from FIG. 14, it is possible to adjust the transmittance of the display mode switching layer 50 by varying a voltage to be applied to the first electrode 53 and the second electrode 51. In other words, it is possible to provide the display unit having a light control function (transmittance adjustment function) that is capable of adjusting the transmittance suitably in accordance with the usage environment, more specifically, that is capable of adjusting the transmittance in a multiple-step or non-step manner.

3. Third Embodiment

Figure 15:
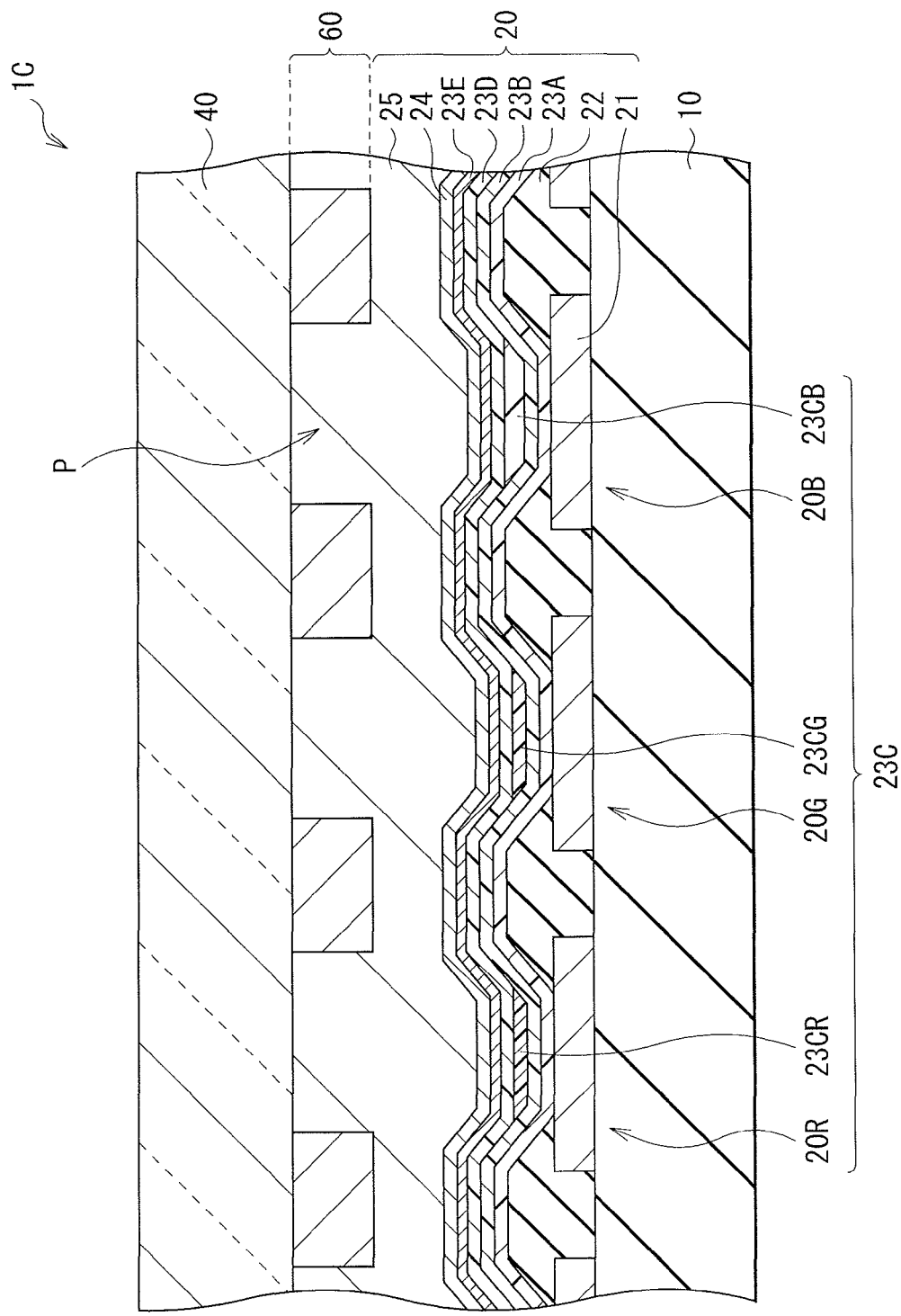
FIG. 15 is a cross-sectional view showing a configuration of a display unit according to a third embodiment of the present disclosure.

FIG. 15 shows a cross-sectional configuration of a display unit 1C according to a third embodiment of the present disclosure. As with the above-described first and second embodiments, in this display unit 1C, a display mode switching layer 60 is provided between the display layer 20 and the counter substrate 40. However, this embodiment is different from the above-described first and second embodiments in that the display mode switching layer 60 allows a changeover between a mirror display (mirror mode) and a black display (display mode) to be made.

Figure 16:
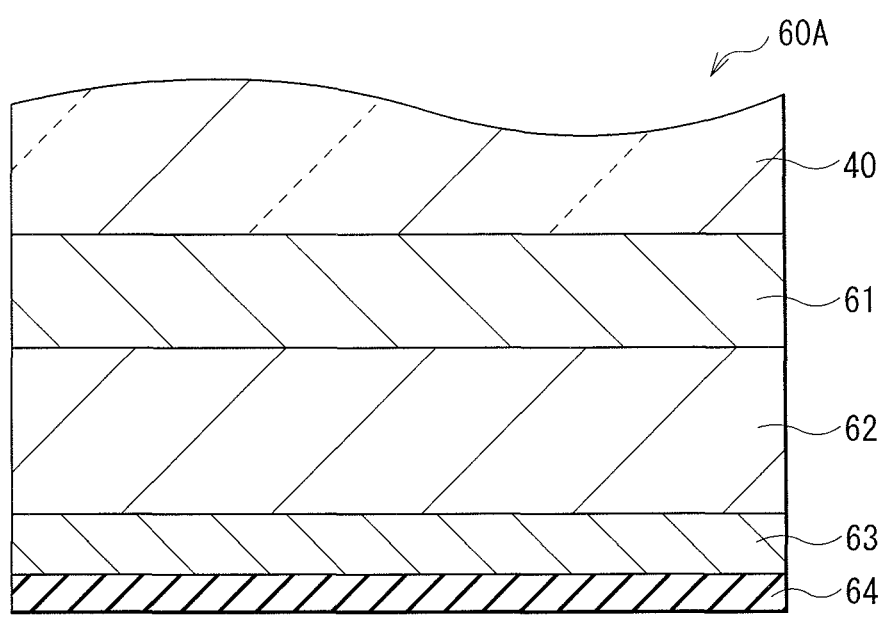
FIG. 16 is a cross-sectional view showing a configuration of a display mode switching layer in the display unit illustrated in FIG. 15.

As described above, the display mode switching layer 60 switches a display mode of the display unit 1C between the mirror mode and the display mode, and has a configuration in which an EC layer 62 is provided between a first electrode 63 and a second electrode 61 as shown in FIG. 16. However, in this embodiment, the first electrode 63 in an EC device 60A is configured of a material that changes a color thereof from a metallic luster into a transparent color by storing hydrogen of a rare-earth metal, such as yttrium and lanthanum, or Mg—Ni alloy, and the like.

Figure 17A:
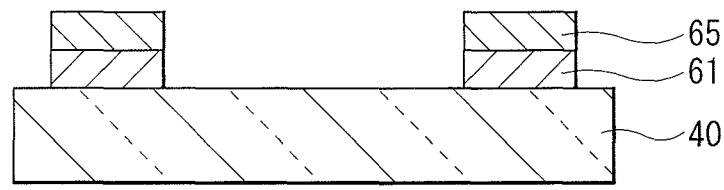
FIG. 17A is a cross-sectional view for explaining an example of a method of manufacturing the display mode switching layer illustrated in FIG. 16.

Each of FIG. 17A to FIG. 18C shows an example of a manufacturing process for the display mode switching layer 60. First, as shown in FIG. 17A, on the counter substrate 40, for example, an Mg—Ni alloy film is formed with a thickness within a range of about 40 nm to 100 nm, for example, using a vapor-deposition technique such as a sputtering method. For each of Mg and Ni, a separate target may be used, or an Mg—Ni alloy target may be used alternatively. Next, a Pd film is formed with a thickness within a range of about 1 nm to 6 nm, for example, using the same method as above. Subsequently, a photoresist is coated on the Pd film using a spin coater, a roll coater, or the like followed by baking, and then the exposure is performed by the use of a glass mask to pattern the photoresist. Thereafter, the Mg—Ni film and the Pd film are patterned in a dry etching method using gas such as $CF_4$, and then the resist is removed by performing, for example, an ashing treatment to form the second electrode 61 and a catalyst layer 65.

Figure 17B:
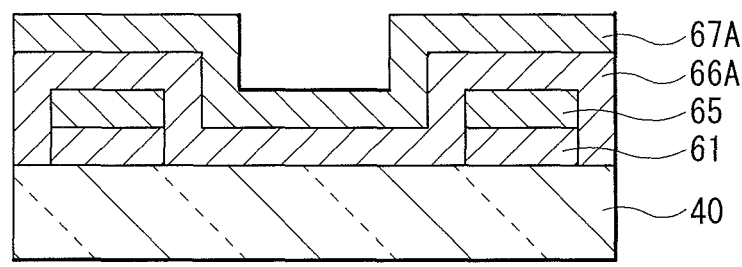
FIG. 17B is a cross-sectional view showing a process following on the process shown in FIG. 17A.
Figure 17C:
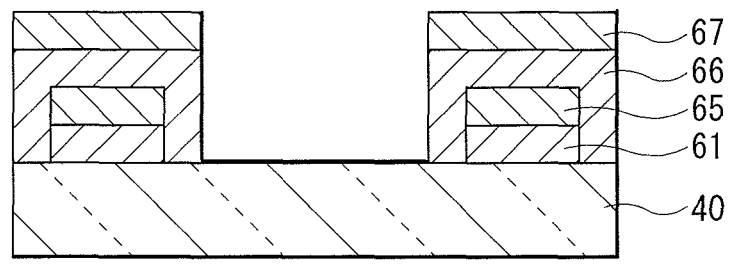
FIG. 17C is a cross-sectional view showing a process following on the process shown in FIG. 17B.

Next, as shown in FIG. 17B, on the counter substrate 40 and the catalyst layer 65, a $Ta_2O_5$ film (66A) is formed with a thickness of at least about 50 nm but no more than about 500 nm, for example, using a sputtering method, for example, and then a $WO_3$ film (67A) is formed with a thickness of at least about 150 nm but no more than about 500 nm, for example, on the $Ta_2O_5$ film while adding hydrogen. Subsequently, as shown in FIG. 17C, an ion-conducting layer 66 and an ion storage layer 67 are formed by patterning the $Ta_2O_5$ film (66A) and the $WO_3$ film (67A) in a dry etching method using gas such as $CF_4$.

Figure 18A:
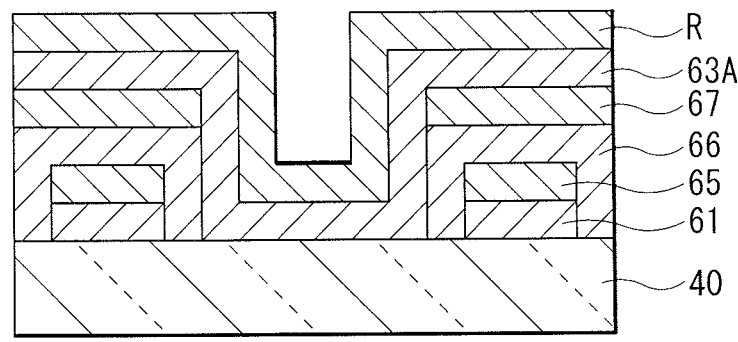
FIG. 18A is a cross-sectional view showing a process following on the process shown in FIG. 17C.
Figure 18B:
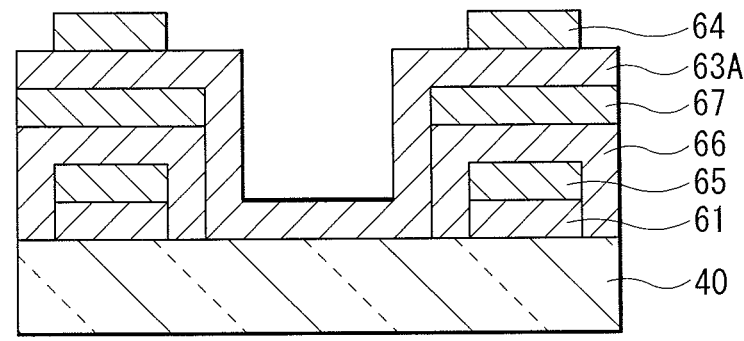
FIG. 18B is a cross-sectional view showing a process following on the process shown in FIG. 18A.

Thereafter, as shown in FIG. 18A, across an area from the ion storage layer 67 to the counter substrate 40, for example, an ITO film 63A is formed with a thickness of at least about 50 nm but no more than about 200 nm using a sputtering method, for example, and then a resist R for a black matrix is coated on this ITO film 63A. Subsequently, as shown in FIG. 18B, the resist R is subjected to the exposure and development to be patterned in a predetermined shape.

Figure 18C:
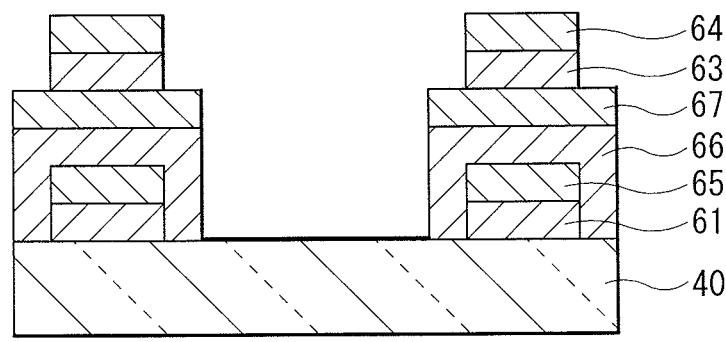
FIG. 18C is a cross-sectional view showing a process following on the process shown in FIG. 18B.

Finally, as shown in FIG. 18C, the ITO film 63A is dry-etched using gas such as $CF_4$ to form the first electrode 63, thereby bringing the display mode switching layer 60 to completion. It is to be noted that the resist R is usable as a light-blocking film 64 by leaving it on the first electrode 63 as it is. As with the above-described embodiments, this light-blocking film 64 suppresses reflection of light emitted from the light-emitting layer 23C, and represents a black color when the second electrode 61 is put in a transparent state, that is, when the display unit 1C is put in the display mode. It is to be noted that Table 2 summarizes display modes at the time when the display mode switching layer 60 and each of the light-emitting devices 20R, 20G, and 20B of the display unit 1C according to this embodiment are put in an on-state and an off-state.

TABLE 2

| Display mode switching layer | | Light-emitting | |
|---|---|---|---|
| First electrode | Second electrode | device | Display modes |
| Positive | Negative | Off | Mirror mode |
| Negative | Positive | On | Display mode |
| Positive | Negative | On | Mirror mode and display mode |

As described above, in this embodiment of the present disclosure, the second electrode 63 of the display mode switching layer 60 is formed using a material the color of which changes reversibly from a metallic luster into a transparent color, and thus it is possible to switch the display unit 1C between the mirror mode and the display mode as necessary.

4. Modification Examples

Modification Example 1

Figure 19:
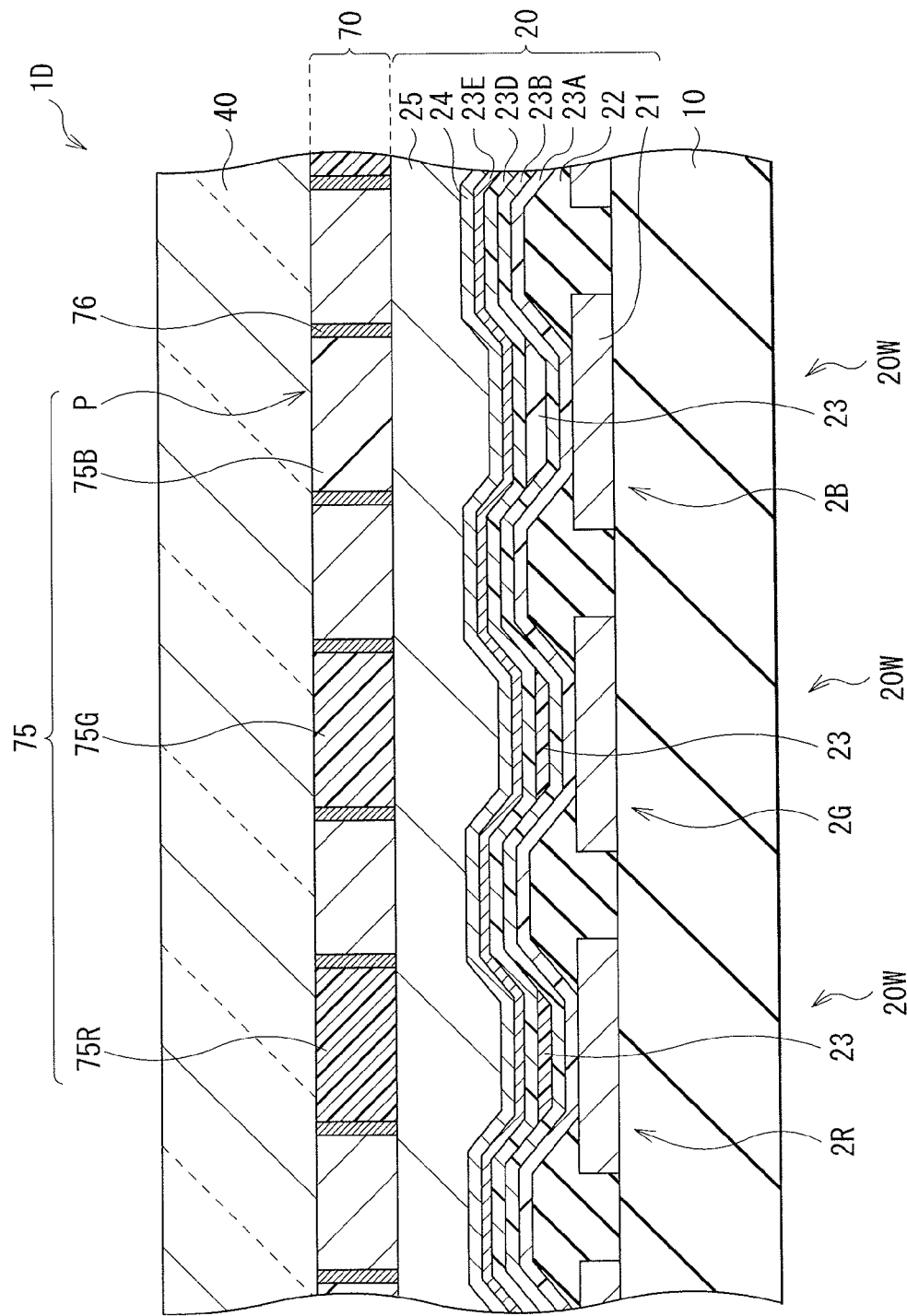
FIG. 19 is a cross-sectional view showing a configuration of a display unit according to a modification example 1 of any of the above-described embodiments of the present disclosure.

FIG. 19 shows a cross-sectional configuration of a display unit 1D according to a modification example of any of the first to third embodiments of the present disclosure. As with the above-described first embodiment and the like, in this display unit 1D, a display mode switching layer 70 is provided between the display layer 20 and the counter substrate 40. However, in this modification example, a light-emitting device that is provided on each of the sub-pixels 2R, 2G, and 2B is a white light-emitting device 20W that emits white light, and at each of apertures P that are provided on the display mode switching layer 70, a corresponding color filter 75 (75R, 75G, and 75B) is arranged.

It is possible to form the light-emitting device 20W in a laminated structure similar to that of each of the above-described light-emitting devices 20R, 20G, and 20B, but a configuration thereof is not limited thereto. For example, a so-called stack structure may be adopted. More specifically, a configuration may be permitted in which a charge-generating layer (not shown in the drawing) is formed on the above-described laminated structure, and a hole injection layer 23A', a hole transport layer 23B', a light-emitting layer 23C', an electron transport layer 23D', and an electron injection layer 23E' are stacked on this charge-generating layer. It is to be noted that the hole injection layer 23A', the hole transport layer 23B', the electron transport layer 23D', and the electron injection layer 23E' on the charge-generating layer may be formed using the same material as that for each layer provided at an underlayer of the charge-generating layer, or using a different material. Further, each of the light-emitting layers 23C and 23C' may be not necessarily formed in a single layer, and may be formed in such a manner that two or more light-emitting layers each of which emits different color light are stacked. In concrete terms, for example, the light-emitting layers 23C and 23C' may be configured as blue and yellow light-emitting layers, respectively. Alternatively, the light-emitting layer 23C may be configured as a blue light-emitting layer, and the light-emitting layer 23C' may be configured in a two-layer structure stacking a red light-emitting layer and a green light-emitting layer.

As with the above-described first to third embodiments, it is possible to configure the display mode switching layer 70 using any one of the EC devices 30A, 50A, and 60A. However, a material having the optical property that is varied by the redox reaction like the EC material used in any of the above-described embodiments may deteriorate the performance due to moisture. Therefore, a protective film 76 may be preferably provided between the display mode switching layer 70 and each of the color filters 75R, 75G, and 75B.

Examples of a material for the protective film 76 may include SiNx, $SiO_2$, and the like. This protective film may be formed using a sputtering or CVD method, and the like. More specifically, for example, as shown in FIG. 5C, the first electrode 33 is formed, and then after removal of a resist R, the resist is coated again between surfaces of the display mode switching layer 30 (70 in this case). Thereafter, the exposure and development are performed to pattern this protective film in a predetermined shape.

In the display unit 1D according to this modification example, the white light-emitting device 20W is formed as a light-emitting device for each of the sub-pixels 2R, 2G, and 2B, and the color filters 75R, 75G, and 75B corresponding to the sub-pixels 2R, 2G, and 2B respectively are arranged at the apertures P of the display mode switching layer 70. This yields the following effects in addition to the effects of the above-described first embodiment.

First, the light-emitting device (white light-emitting device 20W) having a configuration in common in each of the sub-pixels 2R, 2G, and 2B is provided, which eliminates a process of separately providing a color for a light-emitting layer corresponding to each of the sub-pixels 2R, 2G, and 2B. This makes it possible to simplify manufacturing processes, as well as to make a display panel larger in size. Further, use of white light allows the display unit having the higher luminance to be provided.

Moreover, an arrangement of the color filters 75R, 75G, and 75B makes it possible to configure the high-definition display unit 1D.

Modification Example 2

Figure 20:
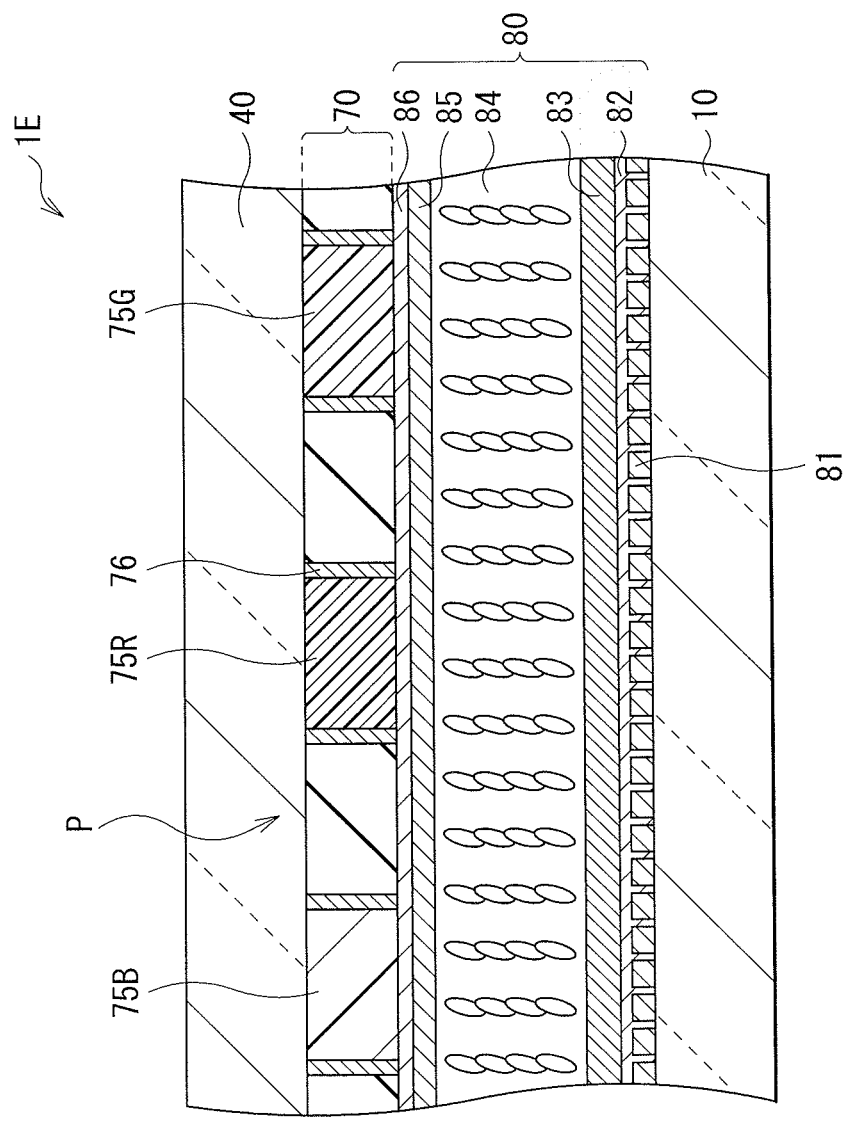
FIG. 20 is a cross-sectional view showing a configuration of a display unit according to a modification example 2 in any of the above-described embodiments of the present disclosure.

FIG. 20 shows a cross-sectional configuration of a display unit 1E according to a modification example 2 of any of the first to third embodiments of the present disclosure and the modification example 1. This display unit 1E is different from any of the display units according to the above-described first to third embodiments and the modification example 1 thereof in that a liquid crystal device including a liquid crystal layer 84 is used for a display layer 80. It is to be noted that the display mode switching layer 70 in this modification example is arranged between the display layer 80 and the counter substrate 40, and any of the color filters 75R, 75G, and 75B corresponding to each color is provided at the aperture P as with the above-described modification example 1.

Figure 21:
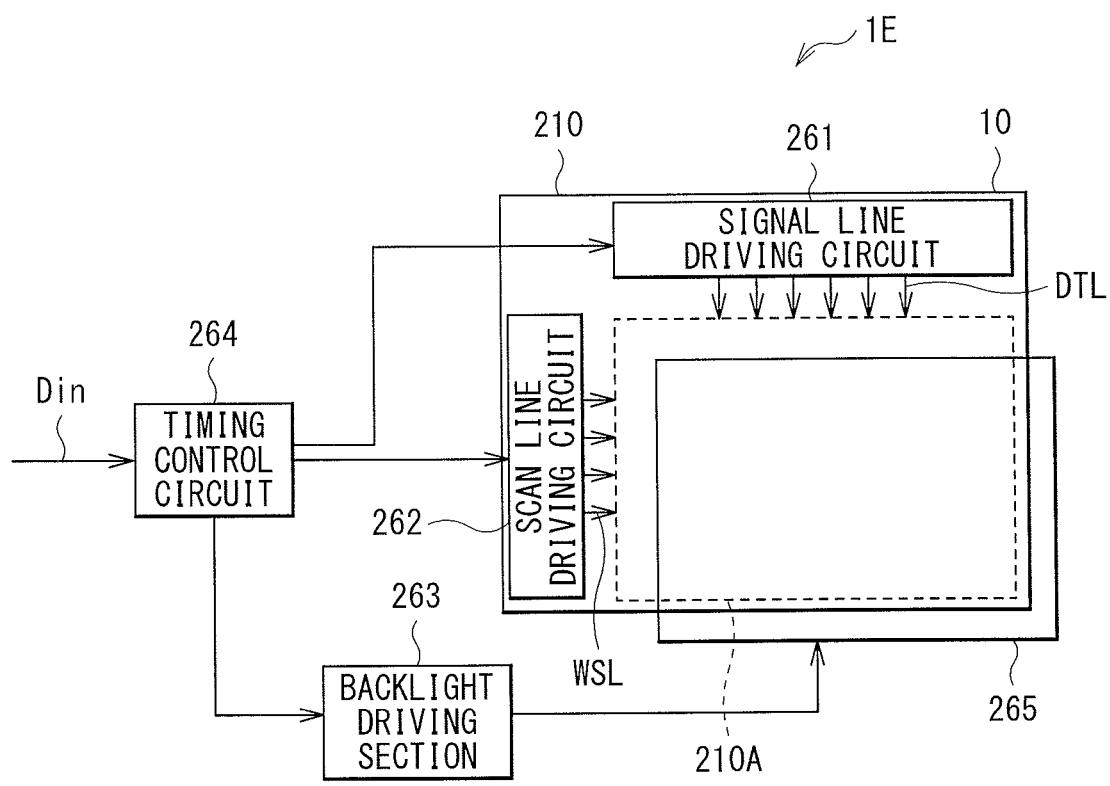
FIG. 21 is a schematic block diagram showing an overall configuration of the display unit illustrated in FIG. 20.

FIG. 21 shows an overall configuration of the display unit 1E. This display unit 1E may include, for example, a liquid crystal display panel 210, a backlight 265, a backlight driving section 263, a timing control section 264, and the like, and performs an image display on the basis of an image signal Din input from outside. On the liquid crystal display panel 210, for example, a display region 210A that serves as an effective pixel region, and a peripheral circuit section (signal line driving circuit 261 and scan line driving circuit 262) for performing a display drive of the display region 210A may be formed. As with the above-described display unit 1A, in the display region 210A, a plurality of pixels 2 (for example, sub-pixels of 2R (red), 2G (green), and 2B (blue)) may be arranged in a matrix pattern, for example. The peripheral circuit section including the signal line driving circuit 261, the scan line driving circuit 262, and the like is formed at the periphery (peripheral region 210B) of the display region 210A of the drive substrate 10 to be hereinafter described.

The timing control section 264 controls drive timing of the signal line driving circuit 261, the scan line driving circuit 262, and the backlight driving section 263, and provides the image signal Din to the signal line driving circuit 261. The scan line driving circuit 262 drives each pixel in a line-sequential manner in accordance with a timing control that is performed by the timing control section 264. The signal line driving circuit 261 provides an image voltage based on the image signal Din to be provided from the timing control section 264 to each pixel. More specifically, the signal line driving circuit 261 generates an image signal in an analog signal form by performing D/A (Digital-to-Analog) conversion for the image signal Din to output such an image signal to each pixel.

The backlight 265 is a light source that emits light with which the liquid crystal display panel 210 is irradiated, and may include, for example, a plurality of LEDs (Light-Emitting Diodes), CCFLs (Cold Cathode Fluorescent Lamps), or the like. This backlight 265 is driven by the backlight driving section 263 to ensure that a lighting-on state and a lighting-off state are controlled.

The display unit 1E is configured in such a manner that the liquid crystal layer 84 is sealed between the drive substrate 10 and the counter substrate 40 that are arranged in opposition to each other. In the display region 210A of the drive substrate 10, a plurality of pixel electrodes 81 may be provided in a two-dimensional array form, for example. On a surface facing the pixel electrodes 81 of the counter substrate 40, there is provided a counter electrode 86. An alignment film 83 is formed on a surface of the liquid crystal layer 84 side of the drive substrate 10, and an alignment film 85 is formed on a surface (surface of the counter electrode 86) of the liquid crystal layer 84 side of the counter substrate 40.

It is to be noted that a polarizing plate (not shown in the drawing) is formed each on the drive substrate 10 side of the pixel electrodes 81 and on the counter substrate 40 side of the counter electrode 86. Further, a seal layer is formed at a circumferential area of the liquid crystal display panel 210, and the liquid crystal layer 84 is sealed between the drive substrate 10 and the counter substrate 40 by means of this seal layer. When the polarizing plate is arranged inside the liquid crystal display panel 210 in such a manner, it is possible to adopt a configuration of the display mode switching layer 70 as described in this modification example, that is, a configuration in which, for example, the EC device 70A and the color filter 75 for switching the display modes are arranged on the same layer.

The drive substrate 10 may be configured of, for example, a glass substrate, and may have, for example, a planar shape of a rectangular form (a planar shape parallel to the display surface). On this drive substrate 10, TFTs (Thin-Film Transistors), storage capacitors (not shown in the drawing), wirings, and the like are arranged in the display region 210A and a peripheral region 210B thereof. In the display region 210A, each of the pixel electrodes 81 is connected with the above-described TFT, and an image voltage corresponding to the image signal Din is provided to the pixel electrode 81 via this TFT.

The pixel electrode 81 is provided for each of the pixels, and may be configured of, for example, a transparent conductive material. As the transparent conductive material, for example, an oxide semiconductor such as ITO, IZO, ZnO, or IGZO (indium, gallium, zinc-containing oxide) may be used.

The counter substrate 40 may be configured of, for example, a glass substrate. On this counter substrate 40, the display mode switching layer 70 having the color filters 75R, 75G, and 75B at the apertures P is provided, and these may be covered by an overcoat film, for example. The counter electrode 86 is provided on this overcoat film.

The counter electrode 86 may be, for example, an electrode in common to each of the pixels (2R, 2G, and 2B), and serves to provide an image voltage to the liquid crystal layer 84 in conjunction with the pixel electrodes 81. As with the above-described pixel electrodes 81, this counter electrode 86 may be configured of, for example, the transparent conductive material as described above.

The liquid crystal layer 84 has a function to control the transmittance of light that is transmitted therethrough depending on a voltage to be provided through the pixel electrode 81 and the counter electrode 86. This liquid crystal layer 84 includes a liquid crystal material that may be display-driven by various modes, such as VA (Vertical Alignment) mode, TN (Twisted Nematic) mode, ECB (Electrically Controlled Birefringence) mode, FFS (Fringe Field Switching) mode, and IPS (In-Plane Switching) mode. As described above, a liquid crystal material for the liquid crystal layer 84 is not limited specifically. However, such a liquid crystal material is useful especially when an alignment control is carried out using an inorganic alignment film like the alignment films 83 and 85 to be described below.

Each of the alignment films 83 and 85 serves to perform an alignment control of the liquid crystal layer 84, and may be configured of, for example, an inorganic alignment film made of a material such as silicon oxide ($SiO_2$). A thickness of each of the alignment films 83 and 85 may be, for example, within a range of about 120 nm to 360 nm. Each of the alignment films 83 and 85 may be formed using a vapor-deposition technique, for example.

A protective film 82 is formed to suppress corrosion of the pixel electrodes 81. This protective film 82 is an inorganic film, such as a silicon oxide ($SiO_2$) film or a silicon nitride (SiN) film that is more chemically-stabilized than the alignment film 83, and may be, for example, within a range of about 30 nm to 70 nm in thickness. This protective film 82 is formed to cover at least the display region 210A, and may be formed using a method, such as a CVD (Chemical Vapor Deposition) method or a sputtering method that is more chemically-stabilized than a vapor-deposition technique. Here, the alignment film 83 is an inorganic film that is formed using the vapor-deposition technique as described above, and thus it is more likely that a defect (such as dangling bond and vacancy) and the like will occur in a film, and a composition ratio of Si to O will not be also fixed in many cases. Therefore, the alignment film 83 is apt to be activated chemically, and when the alignment film 83 and the pixel electrode 81 come in contact with each other, the pixel electrode 81 (for example, ITO) may become corrosive due to reduction of the alignment film 83 (for example, $SiO_2$), and the like. By forming the protective film 82 that is more chemically-stabilized than such an alignment film 83 between the alignment film 83 and the pixel electrode 81, corrosion of the pixel electrode 81 as described above is suppressed.

As described above, as the display devices for the display unit 1E according to the modification example 2, it is possible to use the liquid crystal devices apart from the organic EL devices mentioned as the above-described light-emitting devices 20R, 20G, and 20B. It is to be noted that, in this modification example, the display mode switching layer 70 described in the above-described modification example 1 is used as a display mode switching layer, although it is not limited thereto. For example, as the EC device configuring the display mode switching layer 70, any of the EC device 30A (mirror display and black display), the EC device 40A (transmissive display and black display), and the EC device 50A (mirror display and transmissive display) may be applicable alternatively.

Further, the backlight 265 is used as a light source of the display unit 1E according to this modification example. However, when the display unit 1E is used as a transparent display, an edge light may be used as an alternative. As another method, the backlight 265 may be also omitted.

5. Fourth Embodiment

Figure 22:
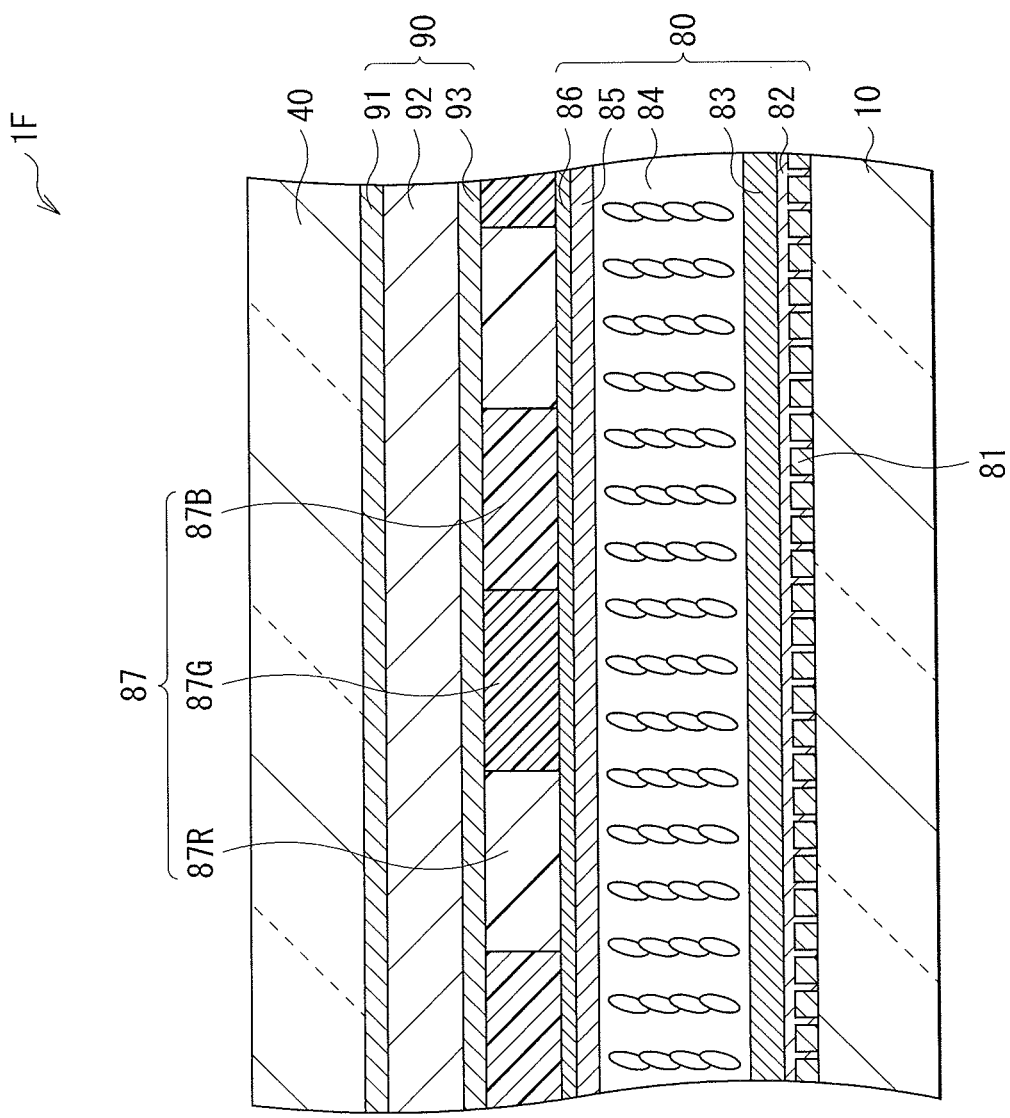
FIG. 22 is a cross-sectional view showing a configuration of a display unit according to a fourth embodiment of the present disclosure.

FIG. 22 shows a cross-sectional configuration of a display unit 1F according to a fourth embodiment of the present disclosure. In this display unit 1F, as with the above-described modification example 2, the display layer 80 is configured of a liquid crystal device including the liquid crystal layer 84. In this embodiment, a color filter layer 87 (87R, 87G, and 87B) is provided on the display layer 80, and a display mode switching layer 90 is arranged between the display layer 80 and the counter substrate 40 with this color filter layer 87 in between.

The display mode switching layer 90 may be provided, for example, on the counter substrate 40 side, and is formed uniformly over a whole surface of the counter substrate 40. For this display mode switching layer 90, it is possible to use an EC device (100A) of an electrophoresis method besides the above-described EC devices (30A, 40A, and 50A) of a redox method. In this embodiment, the description is provided by taking as an example a case where the display mode switching layer 90 is configured of this EC device (100A) of the electrophoresis method.

Figure 23A:
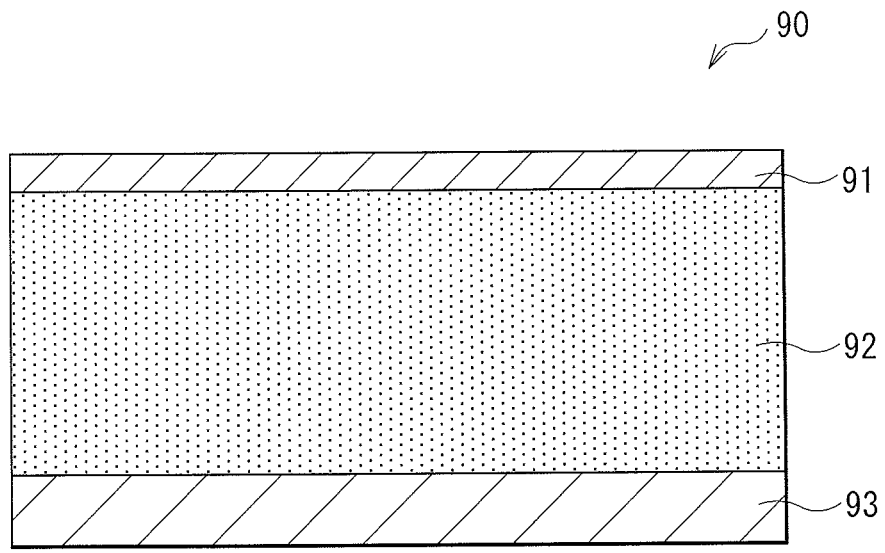
FIG. 23A is a cross-sectional view of a display mode switching layer in the display unit illustrated in FIG. 22 for explaining display modes.
Figure 23B:
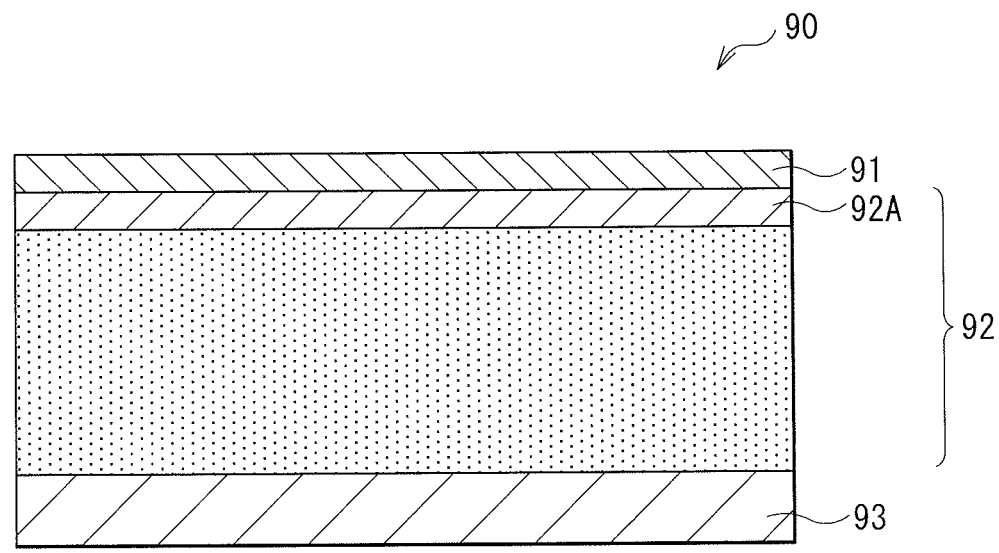
FIG. 23B is a cross-sectional view of a display mode switching layer in the display unit illustrated in FIG. 22 for explaining display modes.

Each of FIG. 23A and FIG. 23B schematically shows a change in the display mode switching layer 90 before application of a voltage (FIG. 23A) and after application of a voltage (FIG. 23B). An EC layer 92 is an electrophoretic layer, and may be formed by filling, for example, gel-like solution ionizing Ag and Cu (for example, solution dissolving polyvinyl butyral in dimethyl sulfoxide) between a first electrode 93 and a second electrode 91. In the display mode switching layer 90 that is configured in such a manner, for example, by applying a negative voltage (for example, about 1.5 to 4 V) to the second electrode 91, a metallic film 92A is formed on the second electrode 91 side in such a manner that, for example, Ag ion is precipitated as Ag as shown in FIG. 23B. This causes a display mode to be switched to the mirror mode. On the other hand, by applying a positive voltage (for example, about 0.5 to 1 V) to the second electrode 91 side, Ag forming the metallic film 92A is ionized, resulting a display mode being switched. On this occasion, when the first electrode 93 is formed using a conductive material having the light transmission property, such as ITO, a display mode is switched to the transparent display mode. Alternatively, when a black matrix layer is provided between each of the color filters 87R, 87G, and 87B of the above-described color filter layer 87, a display mode is switched to the normal display mode.

It is to be noted that a liquid crystal device is used as the display device in this embodiment. However, any of the organic EL devices (light-emitting devices 20R, 20G, and 20B) that are used in any of the display units 1A to 1E according to the above-described first to third embodiments and the modification examples 1 and 2 thereof may be used. Alternatively, the display device may be configured of an inorganic EL device, a semiconductor laser, an LED (Light-Emitting Diode), or the like.

6. Modification Examples

Modification Example 3

Figure 24:
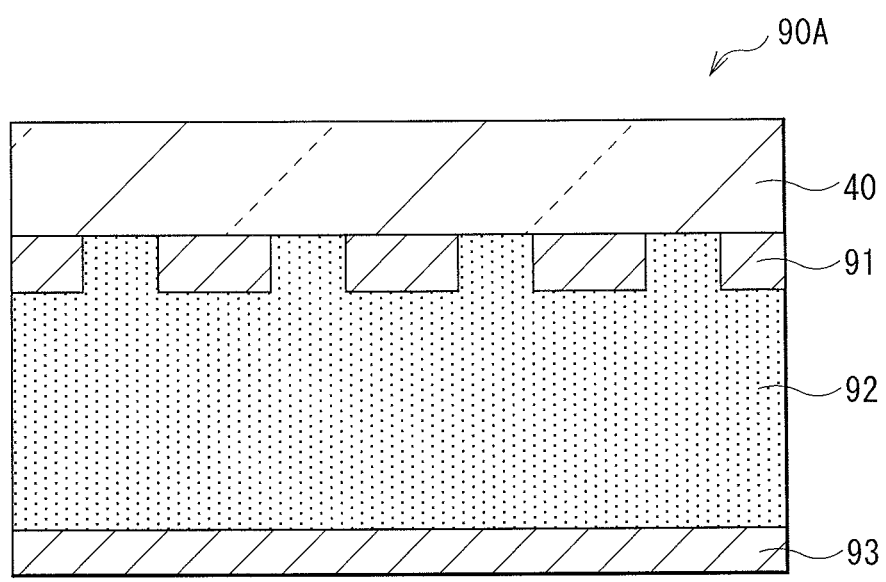
FIG. 24 is a cross-sectional view showing a configuration of a display mode switching layer in a display unit according to a modification example 3 of the fourth embodiment of the present disclosure.

FIG. 24 shows another example (display mode switching layer 90A) of a cross-sectional configuration of the display mode switching layer 90 that configures the display unit 1F according to the fourth embodiment of the present disclosure. This display mode switching layer 90A is different from the display mode switching layer 90 in the above-described fourth embodiment in that the second electrode 91 is divided for each of the sub-pixels 2R, 2G, and 2B that configure each of the pixels 2, that is, the second electrode 91 is formed in a lattice-like matrix pattern. In such a manner, by forming the second electrode 91 for each of the sub-pixels 2R, 2G, and 2B, it is possible to switch display modes for the display region 210A of the display unit 1F for each of the sub-pixels 2R, 2G, and 2B.

It is to be noted that such a partial changeover of display modes for the display region is applicable to not only the display unit 1F according to the above-described fourth embodiment and modification example 3 thereof, but also any of the display units 1A to 1E according to the above-described first to third embodiments and modification examples 1 to 3 thereof.

Figure 25:
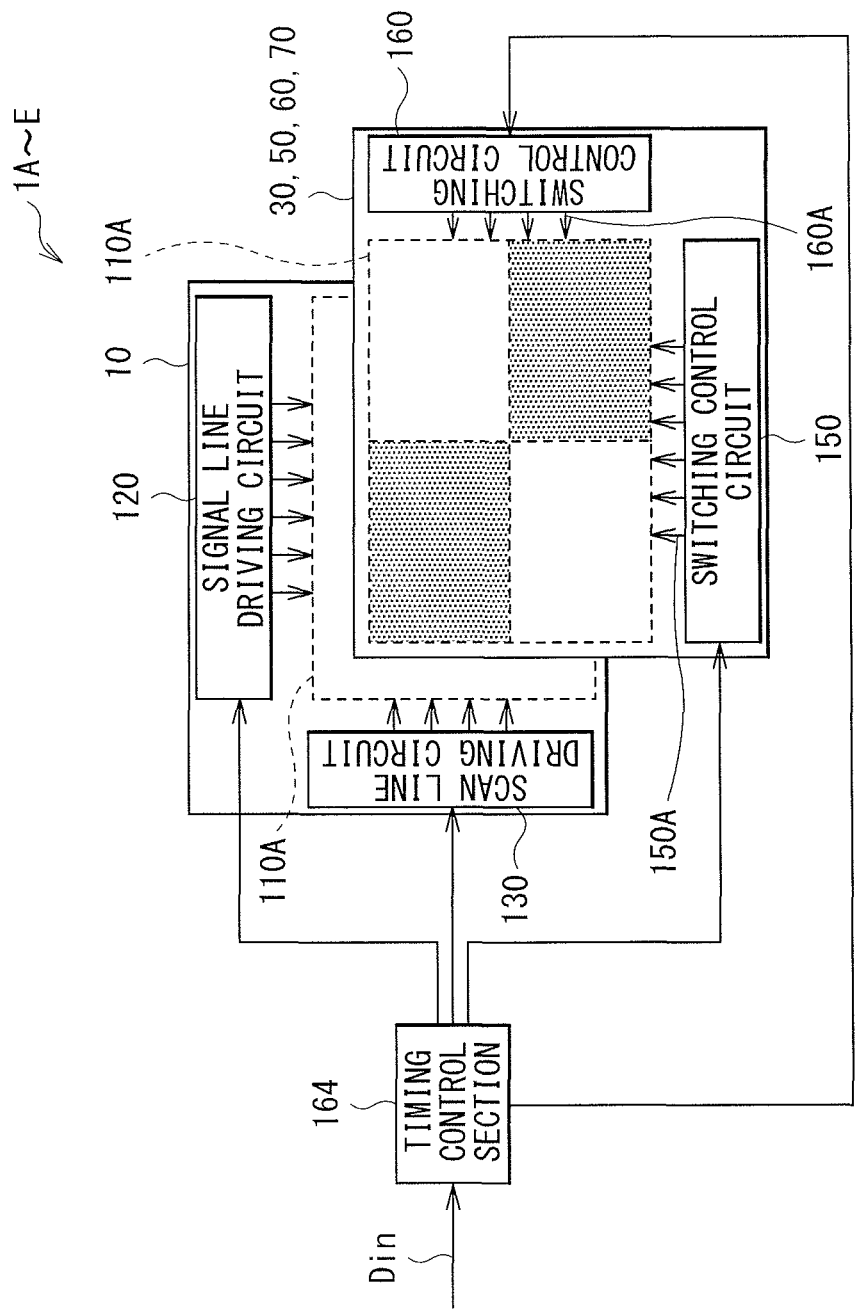
FIG. 25 is a schematic block diagram showing an overall configuration of a display unit that allows display modes to be partially switched.

FIG. 25 schematically shows an overall configuration of the drive substrate 10 on which each of the driving circuits 120 and 130 as well as each of the pixels 2R, 2G, and 2B is provided, and the display mode switching layer 30 (50, 60, or 70) in any of the display units 1A to 1E. In the display mode switching layer 30 (50, 60, or 70), a plurality of control lines 150A and 160A are arranged in each of the row and column directions. The control lines 150A and 160A intersect with each other at any one of a red pixel 2R, a green pixel 2G, and a blue pixel 2B, or at a predetermined position inside a display region 110A. The control lines 150A and 160A are connected with switching control circuits 150 and 160, respectively. To each of the switching control circuits 150 and 160, an image signal to be provided to the signal line driving circuit 120 and the scan line driving circuit 130 on the drive substrate 10, and a control signal for controlling a changeover of display modes of the display mode switching layer 30 (50, 60, or 70) from a timing control section 164 are provided. For example, as shown in FIG. 25, this makes it possible to perform a separation display of a predetermined region of the display mode switching layer 30 (50, 60, or 70) in the mirror mode and the display mode (or the display mode and the transparent display mode, or the mirror mode and the transparent display mode).

Modification Example 4

Figure 26:
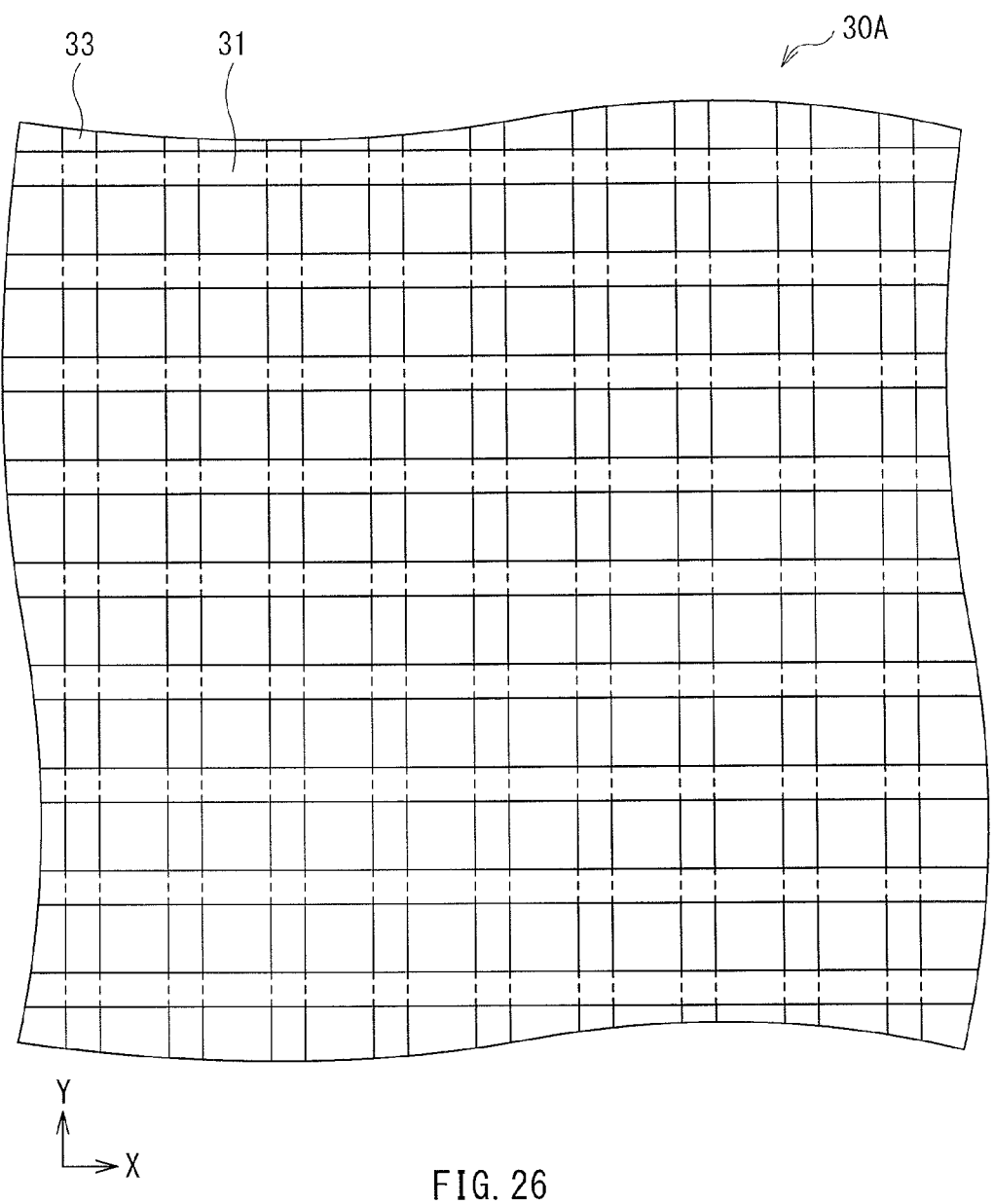
FIG. 26 is a plan view showing a configuration of a display mode switching layer in a display unit according to a modification example 4 of the first embodiment of the present disclosure.

FIG. 26 shows another example (display mode switching layer 30A) of a planar configuration of the display mode switching layer 30 that configures the display unit 1A according to the first embodiment of the present disclosure. This display mode switching layer 30A is different from the display mode switching layer 30 in the above-described first embodiment in that, for example, the first electrode 33 and the second electrode 31 may be provided to extend in a column direction (Y-axis direction) and a row direction (X-axis direction), respectively. Thus, in such a manner that the first electrode 33 and the second electrode 31 are not formed in the same pattern (for example, in a lattice-like shape), but are arranged to intersect with each other, it is possible to switch display modes at an intersection point between the first electrode 33 and the second electrode 31. In other words, as with the above-described modification example 3, it is possible to switch display modes of the display region 110A of the display unit 1A for each of the sub-pixels 2R, 2G, and 2B.

Figure 27A:
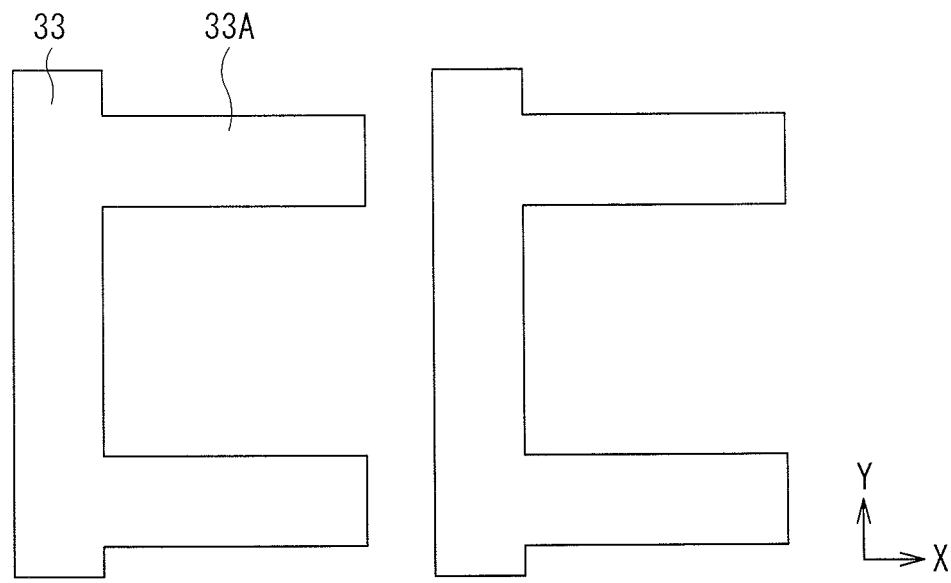
FIG. 27A is a schematic diagram showing an example of an arrangement of a first electrode illustrated in FIG. 26.
Figure 27B:
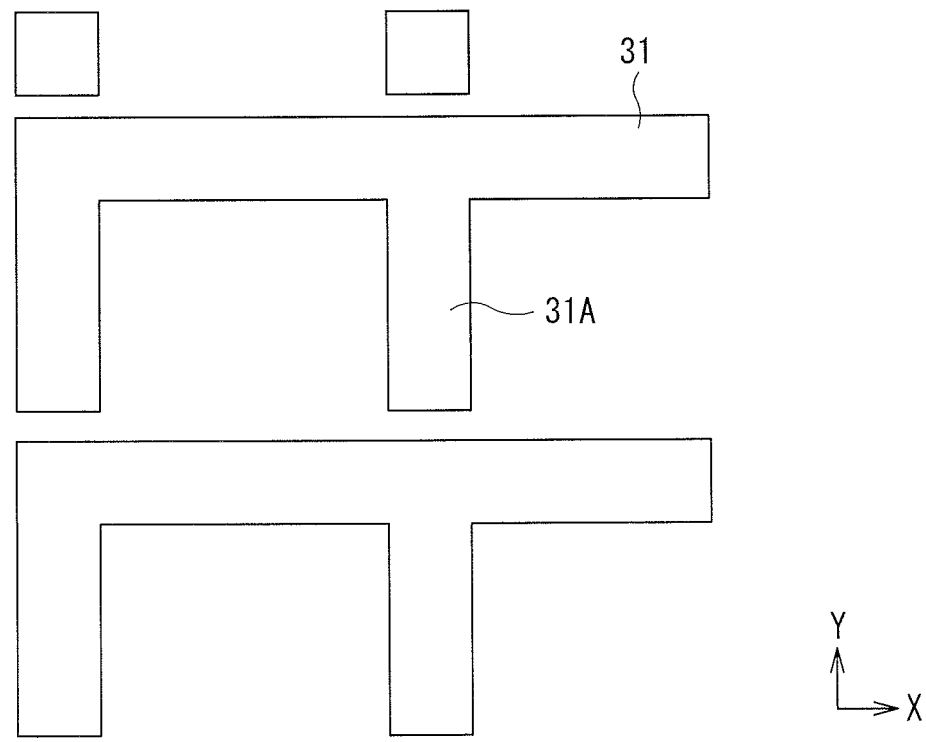
FIG. 27B is a schematic diagram showing an example of an arrangement of a second electrode illustrated in FIG. 26.

It is to be noted that when the first electrode 33 and the second electrode 31 are patterned simply in a linear shape as shown in FIG. 26, the area of an intersection point is small, and thus it is difficult to achieve the sufficient characteristics as a mirror (or BM). Therefore, for example, as shown in FIG. 27A and FIG. 27B, a convex part 33A that is protruding in X-axis direction may be formed on a part of the first electrode 33 extending in Y-axis direction, and a convex part 31A that is protruding in Y-axis direction may be formed on a part of the second electrode 31 extending X-axis direction. On this occasion, each of the convex parts 33A and 31A may be preferably formed at an intersection point between the first electrode 33 and the second electrode 31. This makes it possible to enlarge the area for switching display modes, which allows the sufficient characteristics as a mirror (or BM) to be achieved.

It is to be noted that such a partial changeover of display modes in the display region is applicable to not only the display unit 1A according to the above-described first embodiment, but also any of the display units 1B to 1E according to the above-described second to fourth embodiments and modification examples 1 and 2 thereof.

7. Application Examples

Any of the display units 1A to 1F described in the above-described first to fourth embodiments and modification examples 1 to 4 may be mounted on electronic apparatuses in every field that display images (or video pictures) as mentioned below, for example.

Application Example 1

Figure 28A:
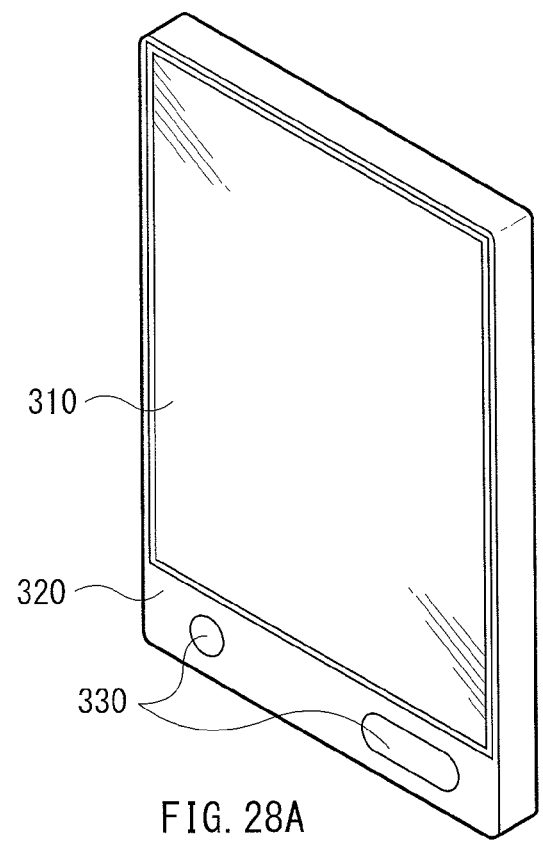
FIG. 28A is a perspective view showing an external appearance of a front side of an application example 1 for any of the display units according to the above-described embodiments and the like of the present disclosure.
Figure 28B:
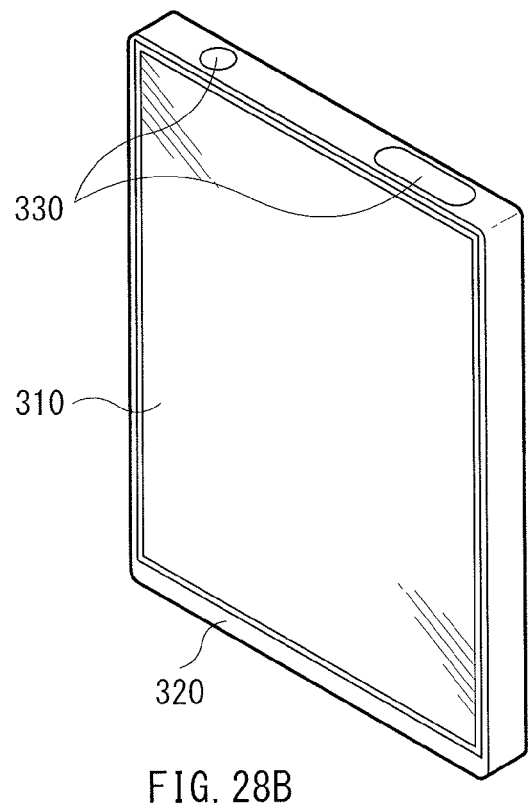
FIG. 28B is a perspective view showing an external appearance of a rear side of the application example 1 for any of the display units according to the above-described embodiments and the like of the present disclosure.

Each of FIG. 28A and FIG. 28B shows an external appearance of a smartphone. This smartphone may have, for example, a display section 310 (display unit 1A), a non-display section (chassis) 320, and an operating section 330. The operating section 330 may be provided in the front side or on the top side of the non-display section 320.

Application Example 2

Figure 29:
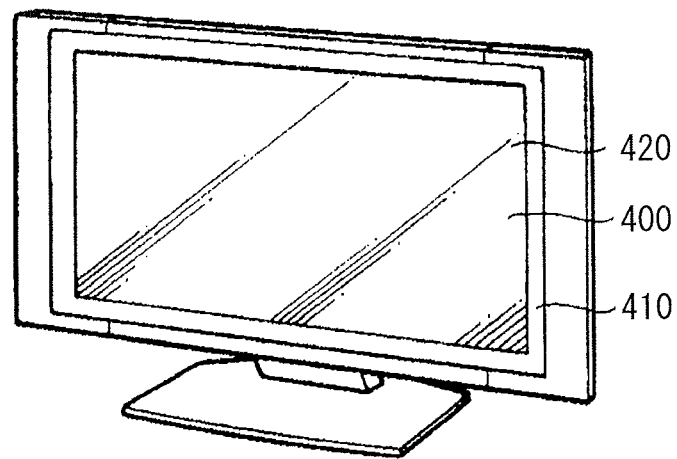
FIG. 29 is a perspective view showing an external appearance of an application example 2.

FIG. 29 shows an external appearance configuration of a television receiver. This television receiver may have, for example, an image display screen section 400 (display unit 1A) including a front panel 410 and a filter glass 420.

Application Example 3

Figure 30A:
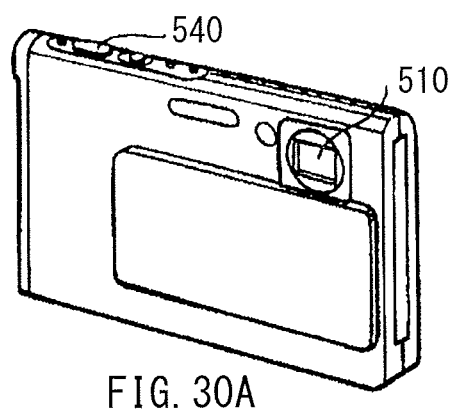
FIG. 30A is a perspective view showing an external appearance of an application example 3 that is viewed from the front side.
Figure 30B:
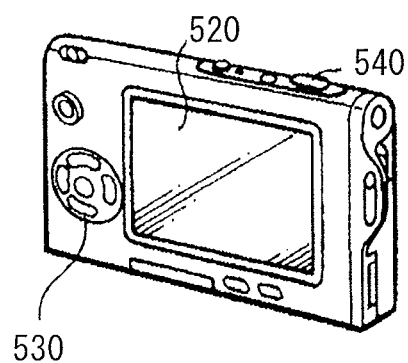
FIG. 30B is a perspective view showing an external appearance of the application example 3 that is viewed from the rear side.

Each of FIG. 30A and FIG. 30B shows an external appearance configuration of a digital still camera, illustrating a front side and a rear side, respectively. This digital still camera may have, for example, a light-emitting section 510 for flashing, a display section 520 (display unit 1A), a menu switch 530, and a shutter button 540.

Application Example 4

Figure 31:
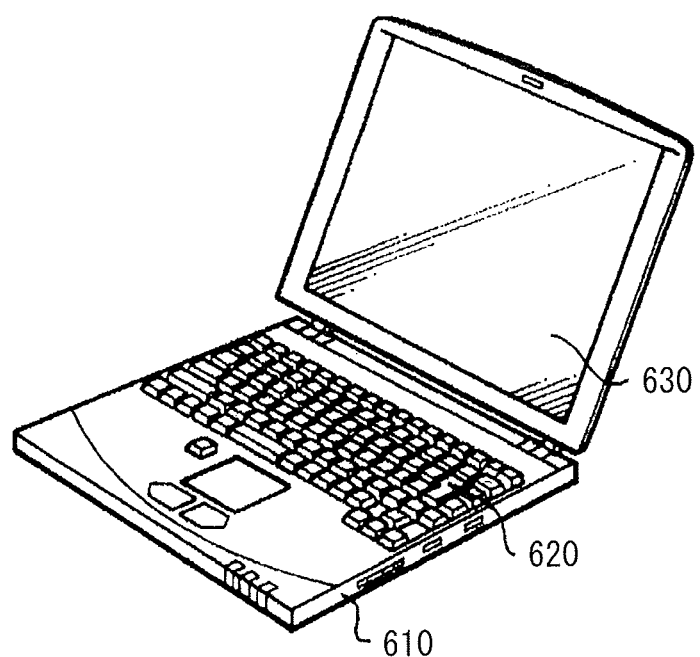
FIG. 31 is a perspective view showing an external appearance of an application example 4.

FIG. 31 shows an external appearance configuration of a notebook personal computer. This notebook personal computer may have, for example, a main unit 610, a keyboard 620 for operation of entering characters and the like, and a display section 630 (display unit 1A) for displaying images.

Application Example 5

Figure 32:
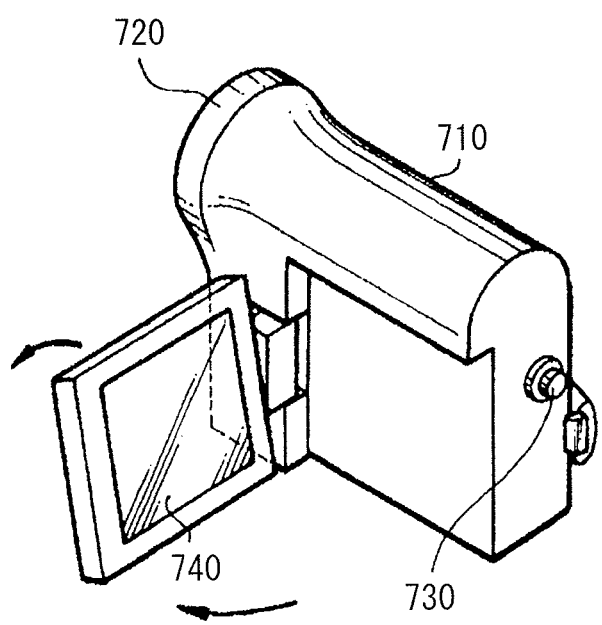
FIG. 32 is a perspective view showing an external appearance of an application example 5.

FIG. 32 shows an external appearance configuration of a video camera. This video camera may have, for example, a main unit section 710, a lens 720 for photographing a subject that is provided at the front lateral surface of this main unit section 710, a start/stop switch 730 at the photographing time, and a display section 740 (display unit 1A).

Application Example 6

Figure 33A:
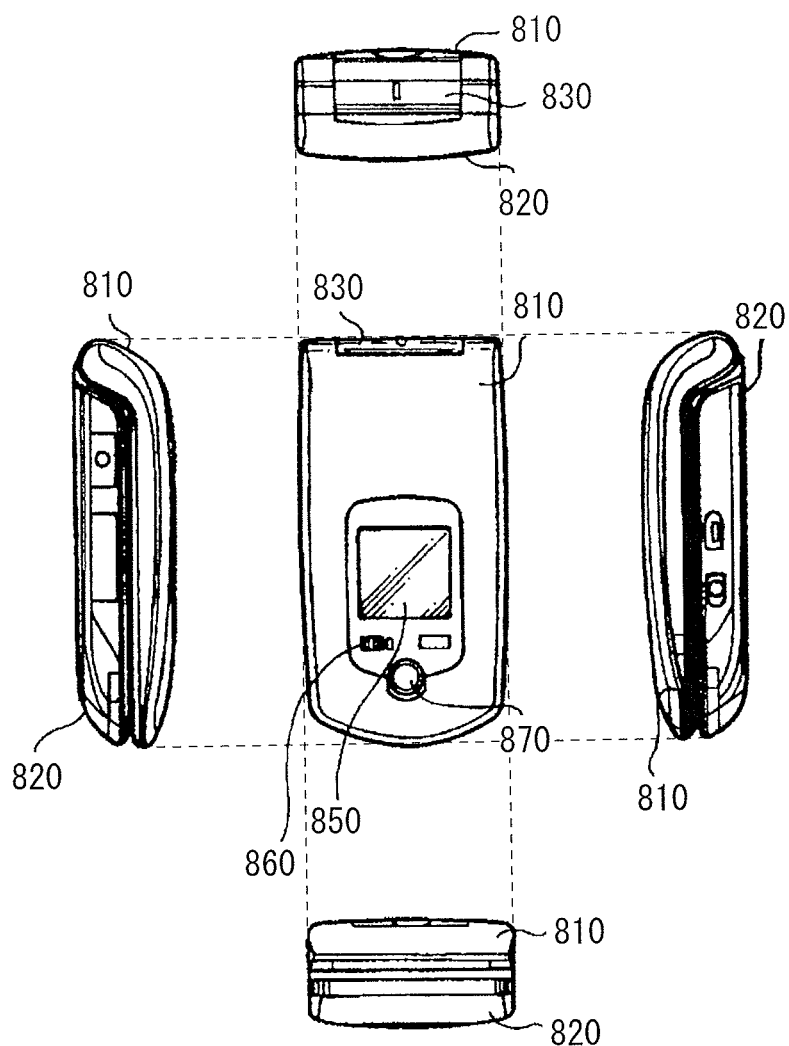
FIG. 33A is a front view, a left side view, a right side view, a top view, and a bottom view of an application example 6 in a closed state.
Figure 33B:
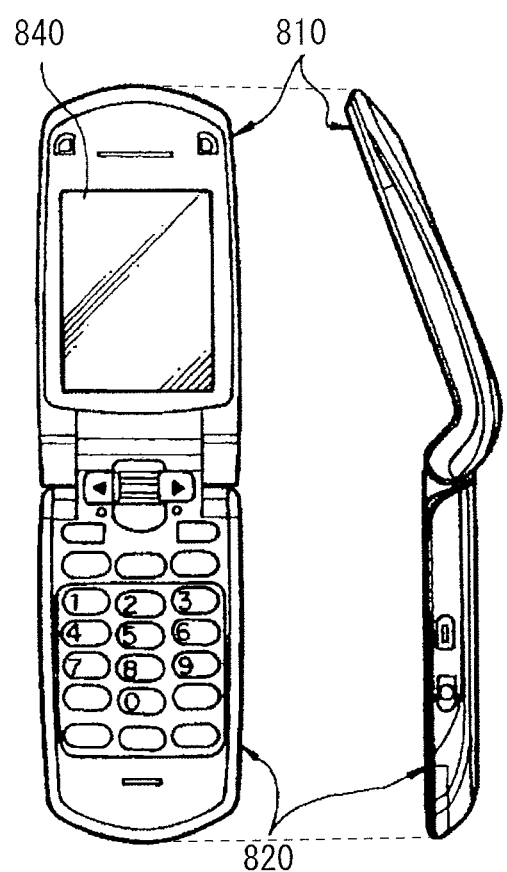
FIG. 33B is a front view and a side view of the application example 6 in an open state.

Each of FIG. 33A and FIG. 33B shows an external appearance configuration of a mobile phone. FIG. 33A shows a front view, a left side view, a right side view, a top view, and a bottom view of the mobile phone in a closed state. FIG. 33B shows a front view and a side view of the mobile phone in an open state. For example, this mobile phone may join an upper chassis 810 and a lower chassis 820 by means of a connecting section (hinge section) 830, and may have a display 840 (any of the display units 1A to 1H), a sub-display 850, a picture light 860, and a camera 870.

Application Example 7

Figure 34:
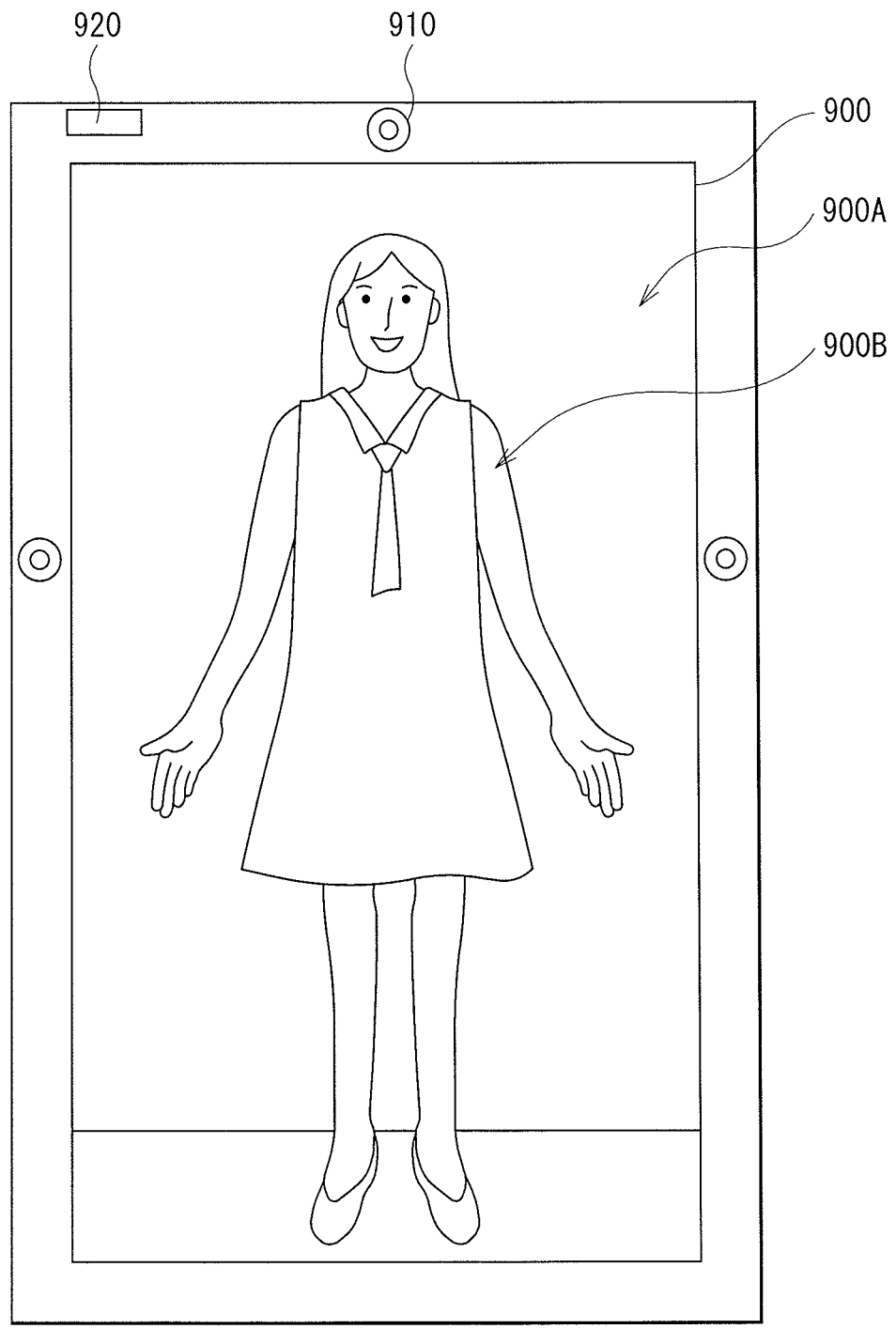
FIG. 34 is a perspective view showing an external appearance of an application example 7.

FIG. 34 shows an external appearance configuration of a figure mirror display. This figure mirror display may have, for example, a mirror section 900, cameras 910 arranged at the periphery of the mirror section 900 to get a grasp of a position of an object, and an illuminance sensor 920 that determines a usage environment of the figure mirror display to adjust luminance and the like of display images. In such a figure mirror display, by combining a mirror mode and a display mode for the mirror section 900, it is possible to perform a display in such a manner that, for example, images of clothing and the like may be overlaid on a person in the mirror section 900.

It is to be noted that a position of an image to be displayed is determined from a position of a camera image. On this occasion, when a reflected person is automatically focused, a change in an image frame occurs, but such a change is resolved by preliminarily storing an image frame position of the mirror section 900 for a focusing step value. Further, when a picture image is overlaid on a mirror image, it is difficult to focus both images from a relationship of parallax of both eyes. Therefore, perspective representation, motion parallax, and the like are used for display images, and it is possible to grasp a distance as far as an object using an autofocus step value, and to find out how much adjustment should be made. In such a manner, an ultrasonic sensor may be arranged to measure a distance between an object.

Further, it is possible to automatically put an outer circumferential area of the mirror section 900 in an all-white display state as an alternative of illumination. This allows the mirror section 900 to be used as a mirror even in a dark place.

Application Example 8

Figure 35A:
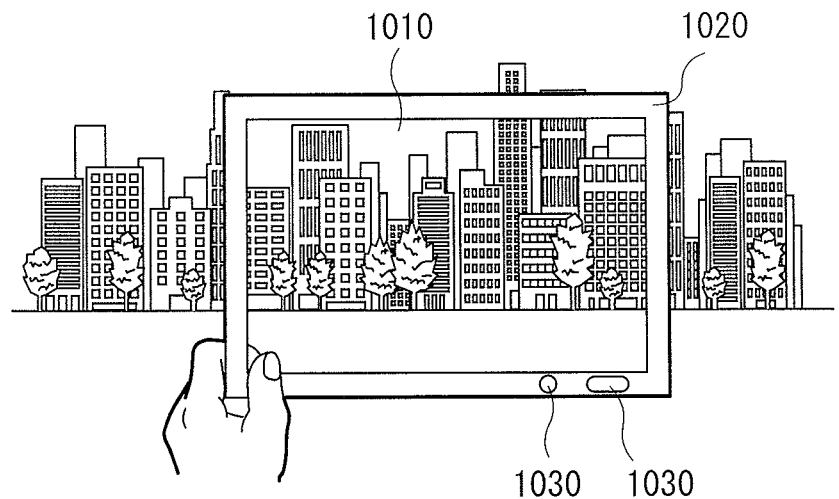
FIG. 35A is a schematic diagram showing an external appearance at the time of a transparent display mode of an application example 8.
Figure 35B:
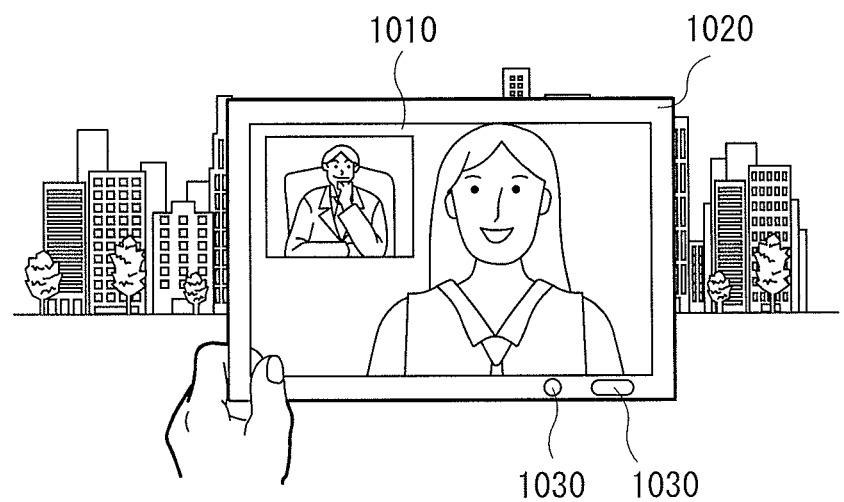
FIG. 35B is a schematic diagram showing an external appearance at the time of a display mode of the application example 8.

Each of FIG. 35A and FIG. 35B shows an external appearance of a mobile display. This mobile display may have, for example, a display section 1010 (display unit 1B), a non-display section (chassis) 1020, and an operating section 1030. In this mobile display, by using the display unit 1B according to the above-described second embodiment, it is possible to make a changeover between the transparent display mode (FIG. 35A) and the display mode (FIG. 35B). Further, it is also possible to display images or textural information with a background of the display section 1010 transmitted therethrough.

The present disclosure is described thus far with reference to the first to fourth embodiments and the modification examples 1 to 4. However, the present disclosure is not limited to the above-described embodiments and the like, and various modifications may be made. For example, in the above-described first to third embodiments and the modification example 1, the description is provided by taking the display unit of the top-emission type as an example. However, a type of the display unit is not limited thereto, and the present disclosure is also applicable to the display unit of the bottom-emission type.

Further, a material and a thickness of each layer, or film-forming methods and conditions, and the like that are mentioned in the above-described embodiments and the like are not limited specifically, and any other materials and thicknesses, or any other film-forming methods and conditions may be permitted. In addition, each layer mentioned in the above-described embodiments and the like does not necessarily have to be provided, and may be omitted as appropriate. Further, any layer other than the layers mentioned in the above-described embodiments and the like may be added.

Moreover, in the above-described embodiments and the like, the description is provided by taking as an example a case where the sub-pixels configuring the pixel are three kinds of red pixel, green pixel, and blue pixel. However, a white pixel or a yellow pixel may be added in addition to these three kinds of sub-pixels.

Furthermore, the technology encompasses any possible combination of some or all of the various embodiments described herein and incorporated herein.

It is possible to achieve at least the following configurations from the above-described example embodiments of the disclosure.

(1) A display unit, including:
a pair of a first substrate and a second substrate that are arranged in opposition to each other;
a display layer provided between the first substrate and the second substrate; and
a display mode switching layer having an aperture for each pixel, and provided between the display layer and the second substrate.

(2) The display unit according to (1), wherein the display mode switching layer is configured to switch a display mode by application of a voltage.

(3) The display unit according to (1) or (2), wherein the display mode switching layer is configured to switch a display mode in a display region for each predetermined region, the display region being arranged with the pixels.

(4) The display unit according to any one of (1) to (3), wherein the display mode switching layer is configured to adjust reflectance.

(5) The display unit according to any one of (1) to (4), wherein the display mode switching layer is configured to adjust transmittance.

(6) The display unit according to any one of (1) to (5), wherein the display mode switching layer is configured to switch a display mode between a black display and a mirror display, between the black display and a transmissive display, or switch the display mode to have a combination of one or more of the mirror display, the black display, and the transmissive display.

(7) The display unit according to any one of (3) to (6), wherein
the display mode switching layer includes a plurality of first electrodes extending in a first direction and a plurality of second electrodes extending in a second direction, and
the first electrodes and the second electrodes have intersection points for the respective pixels.

(8) The display unit according to (7), wherein the display mode switching layer is configured to switch the display mode for each of the intersection points of the first electrodes and the second electrodes.

(9) The display unit according to any one of (1) to (8), wherein the display mode switching layer has a light-blocking film on a display layer side thereof.

(10) The display unit according to any one of (1) to (9), wherein the display mode switching layer includes a metallic film.

(11) The display unit according to any one of (1) to (9), wherein the display mode switching layer includes an electrochromic device.

(12) The display unit according to any one of (1) to (11), wherein the display layer includes a liquid crystal layer.

(13) The display unit according to any one of (1) to (11), wherein the display layer includes an organic layer that includes a light-emitting layer.

(14) A display unit, including:
a pair of a first substrate and a second substrate that are arranged in opposition to each other;
a display layer provided between the first substrate and the second substrate; and
a display mode switching layer provided between the display layer and the second substrate.

(15) The display unit according to (14), wherein the display mode switching layer is provided over a whole surface of the second substrate.

(16) An electronic apparatus provided with a display unit, the display unit including:
a pair of a first substrate and a second substrate that are arranged in opposition to each other;
a display layer provided between the first substrate and the second substrate; and
a display mode switching layer having an aperture for each pixel, and provided between the display layer and the second substrate.

(17) An electronic apparatus provided with a display unit, the display unit including:
a pair of a first substrate and a second substrate that are arranged in opposition to each other;
a display layer provided between the first substrate and the second substrate; and a display mode switching layer provided between the display layer and the second substrate.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display unit, comprising:
a pair of a first substrate and a second substrate that are arranged in opposition to each other;
a display layer provided between the first substrate and the second substrate; and
a display mode controlling layer having an aperture for each pixel, and provided between the display layer and the second substrate,
wherein the display mode controlling layer is configured to adjust reflectance to control a display mode.

2. The display unit according to claim 1, wherein the display mode controlling layer is configured to control a display mode by application of a voltage.

3. The display unit according to claim 1, wherein the display mode controlling layer is configured to control a display mode in a display region for each predetermined region, the display region being arranged with the pixels.

4. The display unit according to claim 3, wherein
the display mode controlling layer includes a plurality of first electrodes extending in a first direction and a plurality of second electrodes extending in a second direction, and
the first electrodes and the second electrodes have intersection points for the respective pixels.

5. The display unit according to claim 4, wherein the display mode controlling layer is configured to control the display mode for each of the intersection points of the first electrodes and the second electrodes.

6. The display unit according to claim 3, wherein the display mode controlling layer includes a first electrode and a second electrode that are arranged in opposition to each other, and at least one of the first electrode and the second electrode comprises a plurality of electrodes that extend unidirectionally.

7. The display unit according to claim 1, wherein the display mode controlling layer is configured to further adjust transmittance to control the display mode.

8. The display unit according to claim 7, wherein the display mode controlling layer is configured to adjust the transmittance in a multiple-step or non-step manner.

9. The display unit according to claim 1, wherein the display mode controlling layer is configured to control the display mode between a black display and a mirror display, between the black display and a transmissive display, or switch the display mode to have a combination of one or more of the mirror display, the black display, and the transmissive display.

10. The display unit according to claim 1, wherein the display mode controlling layer has a light-blocking film on a display layer side thereof.

11. The display unit according to claim 1, wherein the display mode controlling layer comprises a metallic film.

12. The display unit according to claim 1, wherein the display mode controlling layer comprises an electrochromic device.

13. The display unit according to claim 1, wherein the display layer comprises a liquid crystal layer.

14. The display unit according to claim 1, wherein the display layer comprises an organic layer that includes a light-emitting layer.

15. The display unit according to claim 1, wherein the display mode controlling layer includes:
a first electrode and a second electrode that are arranged in opposition to each other, and one of the first electrode and the second electrode is configured to change its color reversibly from a metallic luster to a transparent color, the one of the first electrode and the second electrode including a first surface and a second surface, the first surface being in opposition to the other of the first electrode and the second electrode, and the second surface being located on opposite side of the first surface; and
a light-blocking film provided on the second surface of the one of the first electrode and the second electrode.

16. An electronic apparatus provided with a display unit, the display unit comprising:
a pair of a first substrate and a second substrate that are arranged in opposition to each other;
a display layer provided between the first substrate and the second substrate; and
a display mode controlling layer having an aperture for each pixel, and provided between the display layer and the second substrate,
wherein the display mode controlling layer is configured to adjust reflectance to control a display mode.

17. A display unit, comprising:
a pair of a first substrate and a second substrate that are arranged in opposition to each other;
a display layer provided between the first substrate and the second substrate; and
a display mode controlling layer having an aperture for each pixel, and provided between the display layer and the second substrate,
wherein the display mode controlling layer is configured to control a display mode separately for each predetermined region in a display region, and wherein the display region includes the pixels and the predetermined regions.

18. A display unit, comprising:
a pair of a first substrate and a second substrate that are arranged in opposition to each other;
a display layer provided between the first substrate and the second substrate; and
a display mode controlling layer having an aperture for each pixel, and provided between the display layer and the second substrate,
wherein the display mode controlling layer includes a first electrode and a second electrode that are arranged in opposition to each other, and at least one of the first electrode and the second electrode comprising a plurality of electrodes that extend unidirectionally.

19. The display unit according to claim 18, wherein
the first electrode comprises a plurality of first electrodes extending in a first direction and the second electrode comprises a plurality of second electrodes extending in a second direction, and
the first electrodes and the second electrodes have intersection points for the respective pixels.

20. An electronic apparatus provided with a display unit, the display unit comprising:
a pair of a first substrate and a second substrate that are arranged in opposition to each other;

a display layer provided between the first substrate and the second substrate; and a display mode controlling layer having an aperture for each pixel, and provided between the display layer and the second substrate, wherein the display mode controlling layer includes a first electrode and a second electrode that are arranged in opposition to each other, and at least one of the first electrode and the second electrode includes a plurality of electrodes that extend unidirectionally.

21. The electronic apparatus according to claim 20, wherein the first electrode comprises a plurality of first electrodes extending in a first direction and the second electrode comprises a plurality of second electrodes extending in a second direction, and the first electrodes and the second electrodes have intersection points for the respective pixels.

22. A display unit, comprising:

a pair of a first substrate and a second substrate that are arranged in opposition to each other;

a display layer provided between the first substrate and the second substrate; and a display mode controlling layer having an aperture for each pixel, and provided between the display layer and the second substrate, wherein the display mode controlling layer is configured to adjust transmittance of light that is in a vertical direction to a plane of the display mode controlling layer to control a display mode.

23. The display unit according to claim 22, wherein the display mode of the display mode controlling layer includes a transmissive display mode.

* * * * *